(12) United States Patent
Noda et al.

(10) Patent No.: US 7,008,850 B2
(45) Date of Patent: Mar. 7, 2006

(54) METHOD FOR MANUFACTURING A SEMICONDUCTOR DEVICE

(75) Inventors: Takafumi Noda, Shiojiri (JP); Susumu Inoue, Sakata (JP); Masahiko Tsuyuki, Chino (JP); Akihiko Ebina, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/962,111

(22) Filed: Oct. 7, 2004

(65) Prior Publication Data

US 2005/0118759 A1    Jun. 2, 2005

(30) Foreign Application Priority Data

Oct. 10, 2003    (JP) .............................. 2003-352708

(51) Int. Cl.
  *H01L 21/336*  (2006.01)
  *H01L 21/8234* (2006.01)
  *H01L 21/76*   (2006.01)

(52) U.S. Cl. .................. 438/287; 438/200; 438/216; 438/225; 438/258; 438/275; 438/297; 438/439

(58) Field of Classification Search ................ 438/260, 438/439, 287, 23, 200, 216, 275, 258, 225, 438/297; 257/300, 10
See application file for complete search history.

(56) References Cited

U.S. PATENT DOCUMENTS

| | | | |
|---|---|---|---|
| 6,281,050 B1 * | 8/2001 | Sakagami | 438/142 |
| 2002/0052080 A1 * | 5/2002 | Lee | 438/257 |
| 2002/0130314 A1 * | 9/2002 | Yim et al. | 257/10 |
| 2005/0093047 A1 * | 5/2005 | Goda et al. | 257/300 |

* cited by examiner

*Primary Examiner*—Ha Nguyen
*Assistant Examiner*—Cheung Lee
(74) *Attorney, Agent, or Firm*—John J. Penny, Jr.; Edwards Angell Palmer & Dodge

(57) ABSTRACT

A method for manufacturing the semiconductor device of which a transistor and a MNOS type memory transistor, each of which has a different gate withstand voltage and drain withstand voltage, are included in the same semiconductor layer.

11 Claims, 21 Drawing Sheets

METHOD FOR MANUFACTURING A SEMICONDUCTOR DEVICE

The present invention claim priority from Japanese Application No. 2003-352708 filed on Oct. 10, 2003, which is hereby incorporated by reference in its entirety.

BACKGROUND OF THE INVENTION

1. Field of the Invention

The present invention relates to a semiconductor device, especially a method for manufacturing the semiconductor device of which a transistor and a MNOS type memory transistor, each of which has a different gate withstand voltage and drain withstand voltage, are included in the same semiconductor layer.

2. Related Art

In a manufacturing process for high-breakdown-voltage transistor, a high temperature process to form a deep well and a thick gate insulation layer is required as compared with a low-voltage-drive transistor. The high temperature process is specific for a forming process for low-voltage-drive transistor. Thus, conventionally, a high-breakdown-voltage transistor for high voltage operation and a low-voltage-drive transistor are individually formed.

Recently, research and development of so-called SOC (System On Chip), by which system functions conventionally achieved by a combination of IC in multiple numbers are realized in one IC chip, has been carried out.

SUMMARY OF THE INVENTION

One embodiment of the present invention aims to provide a method for manufacturing the semiconductor device of which a transistor and a MNOS type memory transistor, each of which has a different gate withstand voltage and drain withstand voltage, are included in the same semiconductor layer.

In one embodiment of the present invention, a method for manufacturing a semiconductor device that includes a high-breakdown-voltage transistor, a low-voltage-drive transistor, and a MNOS type memory transistor of one aspect of the present invention includes as the following steps: a step of forming a first mask layer above a high-breakdown-voltage transistor forming region in which the high-breakdown-voltage transistor is formed, a low-voltage-drive transistor forming region in which the low-voltage-drive transistor is formed, and a MNOS type memory transistor forming region in which the MNOS type memory transistor is formed of a semiconductor layer; a step of forming a second mask layer above the first mask layer; a step of removing the first mask layer and the second mask layer both of which are formed on a first gate insulation layer forming region of the high-breakdown-voltage transistor; a step of forming a first gate insulation layer in the high-breakdown-voltage transistor forming region by a thermal oxidation method with the first mask layer and the second mask layer as a mask; a step of removing the second mask layer formed above the high-breakdown-voltage transistor forming region, the low-voltage-drive transistor forming region, and the MNOS type memory transistor forming region; a step of removing the first mask layer formed above the MNOS type memory transistor forming region; a step of forming a multilayer film above the high-breakdown-voltage transistor forming region, the low-voltage-drive transistor forming region, and the MNOS type memory transistor forming region, the multilayer film being formed with at least a silicon oxide layer and a silicon nitride layer; a step of removing the multilayer film formed above the high-breakdown-voltage transistor forming region and the low-voltage-drive transistor forming region; a step of removing the first mask layer formed above the low-voltage-drive transistor forming region; a step of forming a second gate insulation layer on the low-voltage-drive transistor forming region; a step of forming a gate electrode on the high-breakdown-voltage transistor forming region, the low-voltage-drive transistor forming region, and the MNOS type memory transistor forming region; and a step of forming a source-drain region on the high-breakdown-voltage transistor forming region, the low-voltage-drive transistor forming region, and the MNOS type memory transistor forming region.

In the method for manufacturing a semiconductor device of one aspect of the invention, a MNOS (Metal Nitride Oxide Semiconductor) type memory transistor includes a MONOS (Metal Oxide Nitride Oxide Semiconductor) type memory transistor. Thus, the multilayer film is the multilayer in which at least the silicon oxide layer and the silicon nitride layer are deposited. For example, a first silicon oxide layer, the silicon nitride layer, and a second silicon oxide layer can be deposited.

In the method for manufacturing a semiconductor device of one aspect of the invention, "a specific layer" (hereinafter, referred as layer B) is formed above another specific layer (hereinafter, referred as layer A) "includes the following cases. One is the case in which the layer B is directly formed on the layer A. The other is the case in which the layer B is formed on the layer A with another layer therebetween. In addition, "source-drain region" means a source region or a drain region.

The method for manufacturing a semiconductor device of one aspect of the invention enables the high-breakdown-voltage transistor, which needs a high temperature process to form a deep well and thick first gate insulation layer as compared with the low-voltage-drive transistor, and the MNOS type memory transistor, which needs a specific process for forming the multilayer film, to be formed on the same semiconductor layer.

In the method for manufacturing a semiconductor device, the multilayer can be formed such that the first silicon oxide layer, the silicon nitride layer, and the second silicon oxide layer are deposited.

The method for manufacturing a semiconductor device can further include a step of forming a well in the low-voltage-drive transistor forming region and the MNOS type memory transistor forming region by an ion implantation. The ion implantation can be performed with the first mask layer.

The method for forming a semiconductor device can further include a step of forming an element isolation region in the high-breakdown-voltage transistor forming region by a LOCOS (Local Oxidation of Silicon) method, and a step of forming an element isolation region in the low-voltage-drive transistor forming region and the MNOS type memory transistor forming region by a trench element isolation method.

In the method for manufacturing a semiconductor device, the LOCOS method includes a recessed LOCOS method and a semi-recessed LOCOS method.

In the method for manufacturing a semiconductor device, the well in the low-voltage-drive transistor forming region and the MNOS type memory transistor forming region can be formed prior to forming the element isolation region in the low-voltage-drive transistor forming region and the MNOS type memory transistor forming region.

In the method for manufacturing a semiconductor device, the well in the low-voltage-drive transistor forming region and the MNOS type memory transistor forming region can be formed after forming the element isolation region in the low-voltage-drive transistor forming region and the MNOS type memory transistor forming region.

In the method for manufacturing a semiconductor device, the high-breakdown-voltage transistor can be formed so as to include an offset insulation layer.

In the method for manufacturing a semiconductor device, the offset insulation layer can be formed by the LOCOS method.

DESCRIPTION OF THE PREFERRED EMBODIMENTS

Embodiments according to the invention will be explained below with reference to the drawings.

1. Semiconductor Device

A semiconductor device according to the method for manufacturing a semiconductor device of one embodiment of the invention will be explained.

Figure 1:
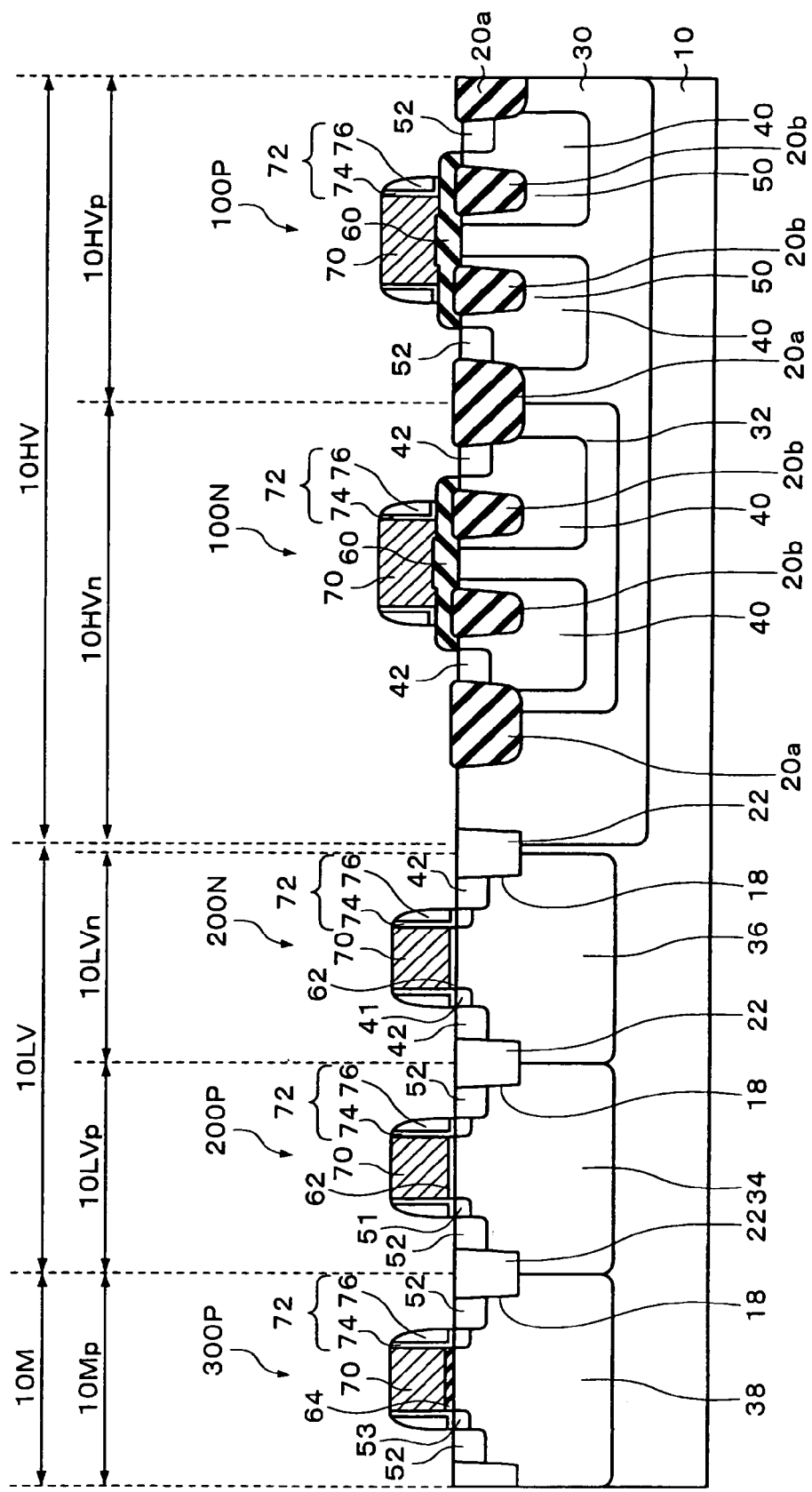
FIG. 1 is a sectional view illustrating a method for manufacturing a semiconductor device of one embodiment of the present invention.

FIG. 1 is a sectional view schematically illustrating a semiconductor device according to the method for manufacturing a semiconductor device of one embodiment of the invention.

The semiconductor device includes a semiconductor layer 10. The semiconductor device includes a high-breakdown-voltage transistor forming region 10HV, a low-voltage-drive transistor forming region 10LV, and a MONOS type memory transistor forming region (hereinafter, referred as MONOS forming region) 10M. The high-breakdown-voltage transistor forming region 10HV includes an n-type high-breakdown-voltage transistor forming region 10HVn and a p-type high-breakdown-voltage transistor forming region 10HVp. The low-voltage-drive transistor forming region 10LV includes an n-type low-voltage-drive transistor forming region 10LVn and a p-type low-voltage-drive transistor forming region 10LVp. The MONOS forming region 10M includes a p-type MONOS type memory transistor forming region (hereinafter, referred as p-type MONOS forming region) 10Mp.

In the n-type high-breakdown-voltage transistor forming region 10HVn, an n-type high-breakdown-voltage transistor 100N is formed. In the p-type high-breakdown-voltage transistor forming region 10HVp, a p-type high-breakdown-voltage transistor 100P is formed. Also, in the n-type low-voltage-drive transistor forming region 10LVn, an n-type low-voltage-drive transistor 200N is formed. In the p-type low-voltage-drive transistor forming region 10LVp, a p-type low-voltage-drive transistor 200P is formed. In the p-type MONOS forming region 10Mp, a p-type MONOS type memory transistor 300P is formed.

Accordingly, the n-type high-breakdown-voltage transistor 100N, the p-type high-breakdown-voltage transistor 100P, the n-type low-voltage-drive transistor 200N, the p-type low-voltage-drive transistor 200P, and the p-type MONOS type memory transistor 300P are provided on the same substrate (the same chip). Here, while five transistors are expediently illustrated in FIG. 1, of course, each transistor is formed on the same substrate in multiple numbers. For example, the n-type MONOS type memory transistor can be formed in the MONOS forming region 10M.

1.1 The High-Breakdown-Voltage Transistor Forming Region 10HV.

Figure 2:
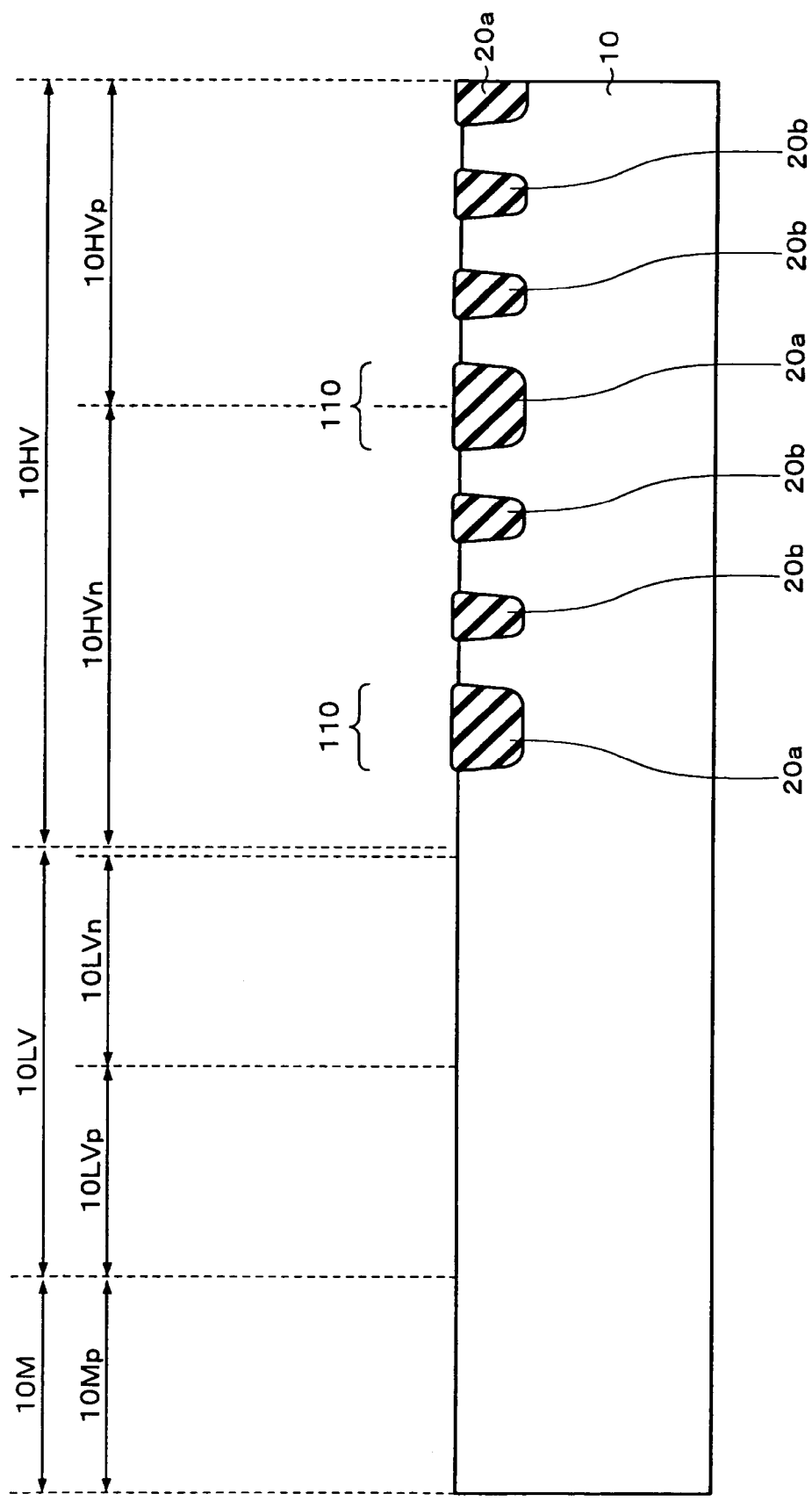
FIG. 2 is a sectional view illustrating the method for manufacturing a semiconductor device of the embodiment.

Firstly, the high-breakdown-voltage transistor forming region 10HV will be explained. In the high-breakdown-voltage transistor forming region 10HV, the n-type high-breakdown-voltage transistor 100N and the p-type high-breakdown-voltage transistor 100P are formed. As shown in FIG. 2, a first element isolation region 110 is formed between the n-type high-breakdown-voltage transistor 100N and the p-type high-breakdown-voltage transistor 100P. The first element isolation region 110 is formed by a semi-recessed LOCOS layer.

Next, a construction of the n-type high-breakdown-voltage transistor 100N and the p-type high-breakdown-voltage transistor 100P will be explained.

The n-type high-breakdown-voltage transistor 100N includes a first gate insulation layer 60, an offset insulation layer 20b formed by the semi-recessed LOCOS layer, a gate electrode 70, an n-type offset region 40, a sidewall insulation layer 72, and an n-type source-drain region 42.

The first gate insulation layer 60 is provided at least above a channel region in a p-type first well 32. The p-type first well 32 is formed in an n-type first well 30. The offset insulation layers 20b are provided at the both ends of the first gate insulation layer 60 in the n-type offset region 40. The gate electrode 70 is formed at least on the first gate insulation layer 60. The n-type offset region 40 is formed in the p-type first well 32. The sidewall insulation layer 72 is formed at a side of the gate electrode 70. The sidewall insulation layer 72 includes, for example, a silicon oxide layer 74 having an L-shaped section and a silicon nitride layer 76 formed on the silicon oxide layer 74. The n-type source-drain region 42 is provided in the semiconductor layer 10 that is located outside the sidewall insulation layer 72.

The p-type high-breakdown-voltage transistor 100P includes the first gate insulation layer 60, the offset insulation layer 20b formed by the semi-recessed LOCOS layer, the gate electrode 70, a p-type offset region 50, the sidewall insulation layer 72, and a p-type source-drain region 52.

The first gate insulation layer 60 is provided at least above the channel region in the n-type first well 30. The offset insulation layers 20b are provided at the both ends of the first gate insulation layer 60 in the p-type offset region 50. The gate electrode 70 is formed at least on the first gate insulation layer 60. The p-type offset region 50 is formed in the n-type first well 30. The sidewall insulation layer 72 is formed at the side of the gate electrode 70. The sidewall insulation layer 72 includes, for example, the silicon oxide layer 74 having an L-shaped section and the silicon nitride layer 76 formed on the silicon oxide layer 74. The p-type source-drain region 52 is provided in the semiconductor layer 10 that is located outside the sidewall insulation layer 72.

1.2 The Low-Voltage-Drive Transistor Forming Region 10LV.

Next, the low-voltage-drive transistor forming region 10LV will be explained. In the low-voltage-drive transistor forming region 10LV, the n-type low-voltage-drive transistor 200N and the p-type low-voltage-drive transistor 200P are formed. A second element isolation region 210 (see FIGS. 9–19) is formed between the n-type low-voltage-drive transistor 200N and the p-type low-voltage-drive transistor 200P.

A construction of each transistor will be explained.

The n-type low-voltage-drive transistor 200N includes a second gate insulation layer 62, the gate electrode 70, the sidewall insulation layer 72, an n-type extension region 41, and the n-type source-drain region 42.

The second gate insulation layer 62 is provided at least above a channel region in a p-type second well 36. The gate electrode 70 is formed at least on the second gate insulation layer 62. The sidewall insulation layer 72 is formed at the side of the gate electrode 70. The sidewall insulation layer 72 includes, for example, the silicon oxide layer 74 having an L-shaped section and the silicon nitride layer 76 formed on the silicon oxide layer 74. The n-type extension region 41 is formed in the p-type second well 36. The n-type source-drain region 42 is provided in the semiconductor layer 10 that is located outside the sidewall insulation layer 72.

The p-type low-voltage-drive transistor 200P includes the second gate insulation layer 62, the gate electrode 70, the sidewall insulation layer 72, a p-type extension region 51, and a p-type source-drain region 52.

The second gate insulation layer 62 is provided at least above the channel region in the n-type second well 34. The gate electrode 70 is formed at least on the second gate insulation layer 62. The sidewall insulation layer 72 is formed at the side of the gate electrode 70. The sidewall insulation layer 72 includes, for example, the silicon oxide layer 74 having an L-shaped section and the silicon nitride layer 76 formed on the silicon oxide layer 74. The p-type extension region 51 is formed in the n-type second well 34. The p-type source-drain region 52 is provided in the semiconductor layer 10 that is located outside the sidewall insulation layer 72.

1.3 The MONOS Forming Region 10M.

Next, the MONOS forming region 10M will be explained. In the MONOS forming region 10M, the p-type MONOS type memory transistor 300P is formed. The p-type MONOS type memory transistor 300P includes the third gate insulation layer 64, the gate electrode 70, the sidewall insulation layer 72, the p-type extension region 53, and the p-type source-drain region 52.

The third gate insulation layer 64 is a multilayer film in which a first silicon oxide layer, a silicon nitride layer, and a second silicon oxide layer are deposited. High electric field is produced in the first silicon oxide layer by the voltage applied to the third gate insulation layer 64. This causes electrons to move between the semiconductor layer and the interface between the first silicon oxide layer and the silicon nitride layer by direct tunnel effect. Thus, a threshold voltage is changed so as to perform writing and erasing. Electrons are trapped in an electron trapping level at the interface between the first silicon oxide layer and the silicon nitride layer so as to store and retain information.

The third gate insulation layer 64 is provided at least above a channel region in an n-type third well 38. The gate electrode 70 is formed at least on the third gate insulation layer 64. The sidewall insulation layer 72 is formed at the side of the gate electrode 70. The sidewall insulation layer 72 includes, for example, the silicon oxide layer 74 having an L-shaped section and the silicon nitride layer 76 formed on the silicon oxide layer 74. The p-type extension region 53 is formed in the n-type third well 38. The p-type source-drain region 52 is provided in the semiconductor layer 10 that is located outside the sidewall insulation layer 72.

2. A Method for Manufacturing a Semiconductor Device.

A method for manufacturing a semiconductor device of one embodiment of the invention will be explained with reference to FIGS. 1 through 18. FIGS. 1 through 18 are sectional views schematically illustrating processes of a method for manufacturing a semiconductor device of one embodiment of the invention.

(1) As shown in FIG. 2, a semi-recessed LOCOS layer 20a playing a role of element isolation and an offset insulation layer 20b for an electric field relaxation are formed in the high-breakdown-voltage transistor forming region 10HV. An example of forming method of the semi-recessed LOCOS layer 20a and the offset insulation layer 20b will be explained below.

A silicon oxide nitride layer is formed on the semiconductor layer 10 by a CVD method. The semiconductor layer 10 includes at least silicon, and is made of silicon and silicon-germanium or the like. The semiconductor layer 10 can be a bulk silicon substrate and a silicon layer of SOI (Silicon On Insulator) substrate. The film thickness of the silicon oxide nitride layer is, for example, from 8 to 12 nm. A silicon nitride layer is formed on the silicon oxide nitride layer by the CVD method. A resist layer is formed on the silicon nitride layer. The resist layer has an opening corresponding to the region for forming the semi-recessed LOCOS layer 20a and the offset insulation layer 20b. By etching the silicon nitride layer, the silicon oxide nitride layer and the semiconductor layer 10 with the resist layer as a mask, a concave portion is formed at the region for forming the semi-recessed LOCOS layer 20a and the offset insulation layer 20b. Then, the resist layer is removed.

Figure 3:
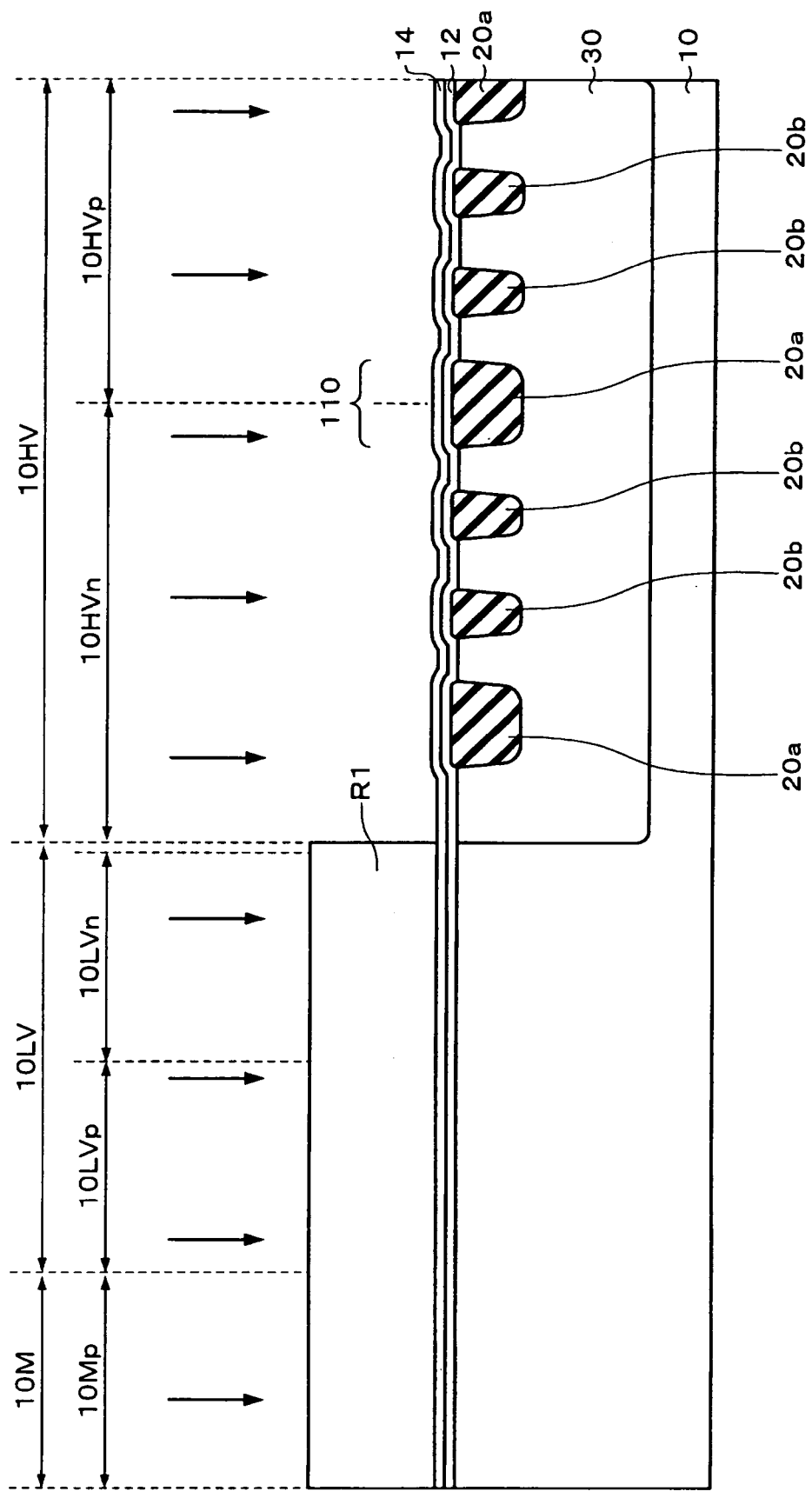
FIG. 3 is a sectional view illustrating the method for manufacturing a semiconductor device of the embodiment.

As shown in FIG. 3, the semi-recessed LOCOS layer 20a as a first element isolation region to define the high-breakdown-voltage transistor forming region 10HV, and the offset insulation layer 20b of the high-breakdown-voltage transistor 100P and 100N are formed by forming the silicon oxide layer on the exposed surface of the semiconductor layer 10 using a thermal oxidation method.

(2) As shown in FIG. 3, the n-type first well 30 is formed in the high-breakdown-voltage transistor forming region 10HV as follows. Firstly, a sacrificial oxide layer 12 is formed over the whole surface of the semiconductor layer 10. For the sacrificial oxide layer 12, for example, the silicon oxide layer is formed. Then, a stopper layer 14 is formed on the sacrificial oxide layer 12. For the stopper layer 14, for example, the silicon nitride can be used. The stopper layer 14 can be formed, for example, by the CVD method.

Next, a resist layer R1 having a fixed pattern is formed. An n-type impurity such like phosphorous, arsenic or the like are implanted into the semiconductor layer 10 at one time or several times with the resist layer R1 as a mask. Then, the resist layer R1 is removed, for example, by an ashing. Subsequently, high-temperature heat treatment is carried out so as to diffuse the impurity layer, thereby forming the n-type first well 30 in the semiconductor layer 10.

Figure 4:
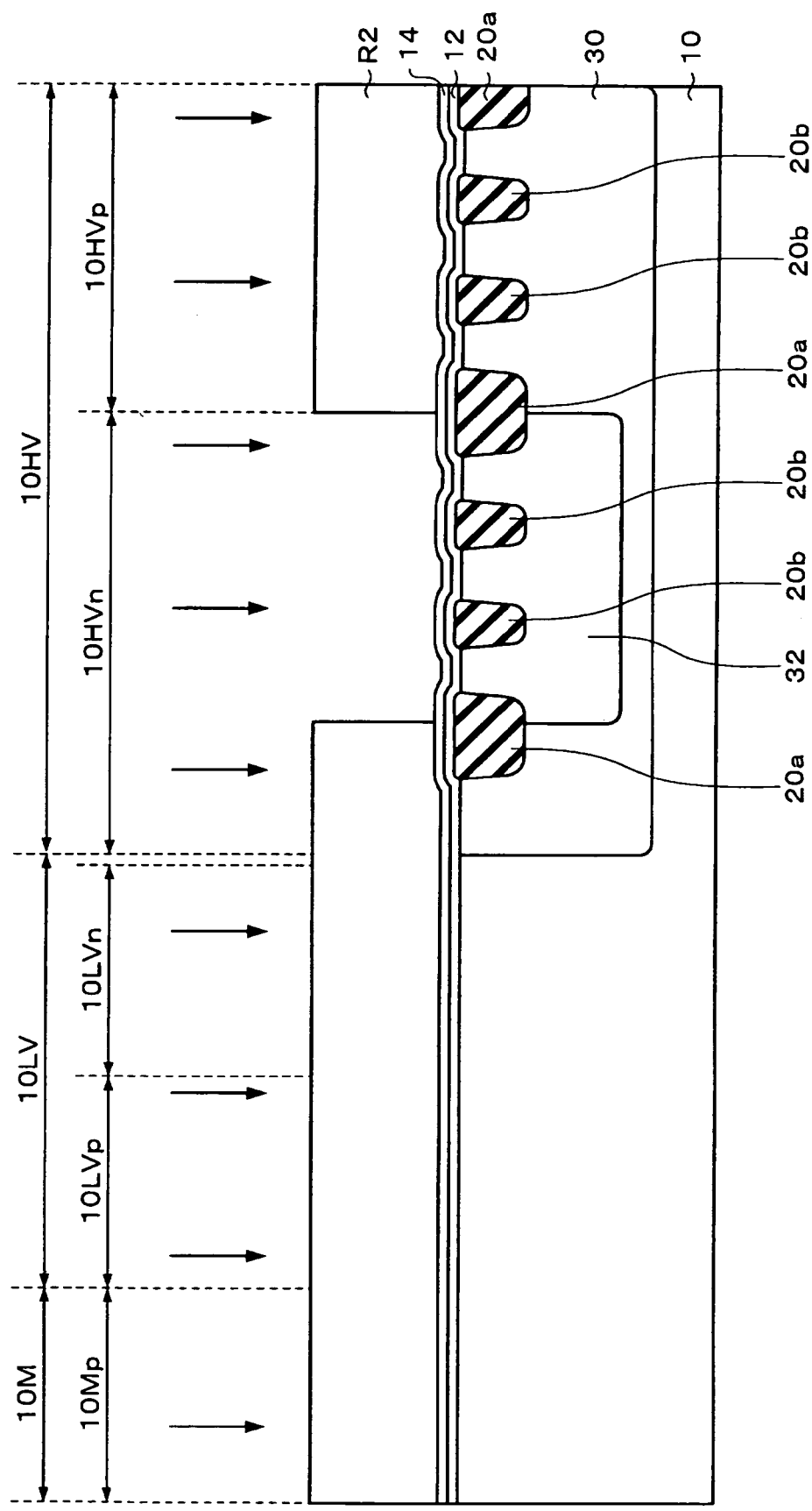
FIG. 4 is a sectional view illustrating the method for manufacturing a semiconductor device of the embodiment.

(3) As shown in FIG. 4, the p-type second well 32 is formed in the high-breakdown-voltage transistor forming region 10HV as follows. A resist layer R2 having a fixed pattern is formed. A p-type impurity is implanted into the semiconductor layer 10 at one time or several times with the resist layer R2 as a mask. Then, the resist layer R2 is removed, for example, by the ashing. Subsequently, high-temperature heat treatment is carried out so as to diffuse the impurity layer, thereby forming the p-type first well 32.

Figure 5:
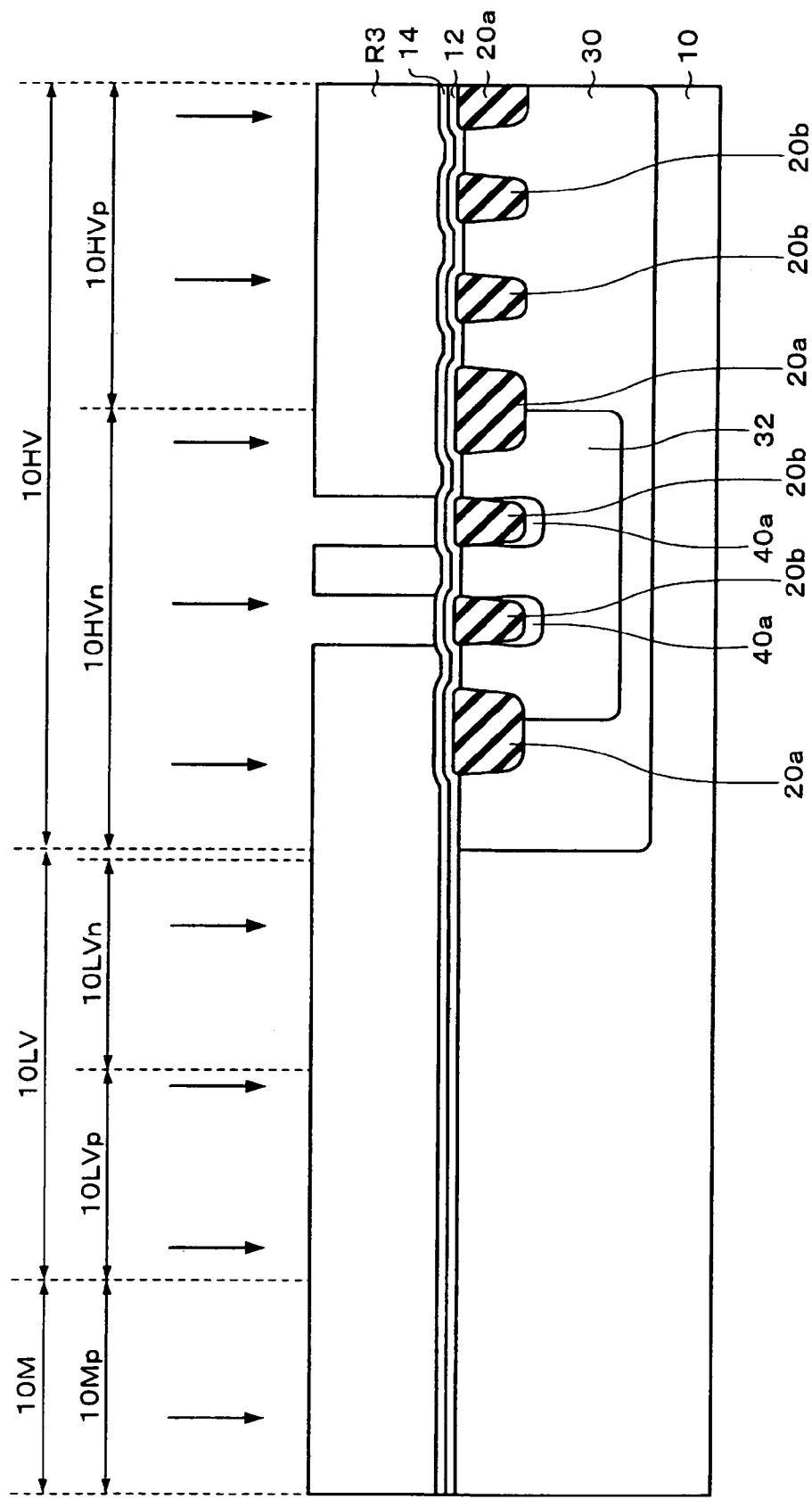
FIG. 5 is a sectional view illustrating the method for manufacturing a semiconductor device of the embodiment.

(4) As shown in FIG. 5, an impurity layer 40a to form an offset region is formed in the n-type high-breakdown-voltage transistor forming region 10HVn as follows. A resist layer R3 covering a fixed region is formed. The impurity layer 40a is formed by implanting the n-type impurity into the semiconductor layer 10 with the resist layer R3 as a mask. Then, the resist layer R3 is removed.

Figure 6:
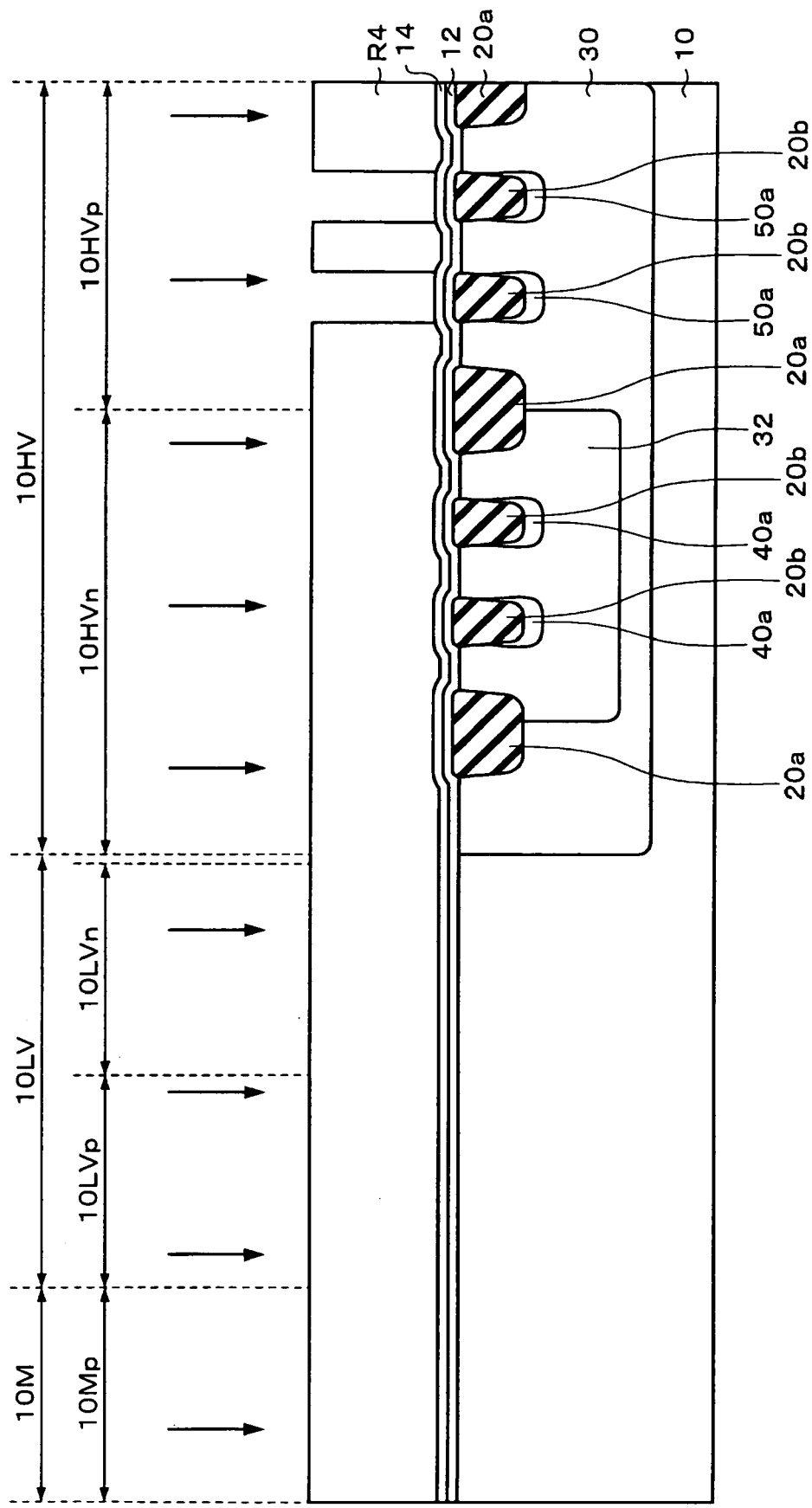
FIG. 6 is a sectional view illustrating the method for manufacturing a semiconductor device of the embodiment.

(5) As shown in FIG. 6, an impurity layer 50a to form an offset region is formed in the p-type high-breakdown-voltage transistor forming region 10HVp as follows. A resist layer R4 covering a fixed region is formed. The impurity layer 50a is formed by implanting a p-type impurity into the semiconductor layer 10 with the resist layer R4 as a mask. Then, the resist layer R4 is removed. As for the order of the process (4) and (5), the revised order of the embodiment can be carried out.

Figure 7:
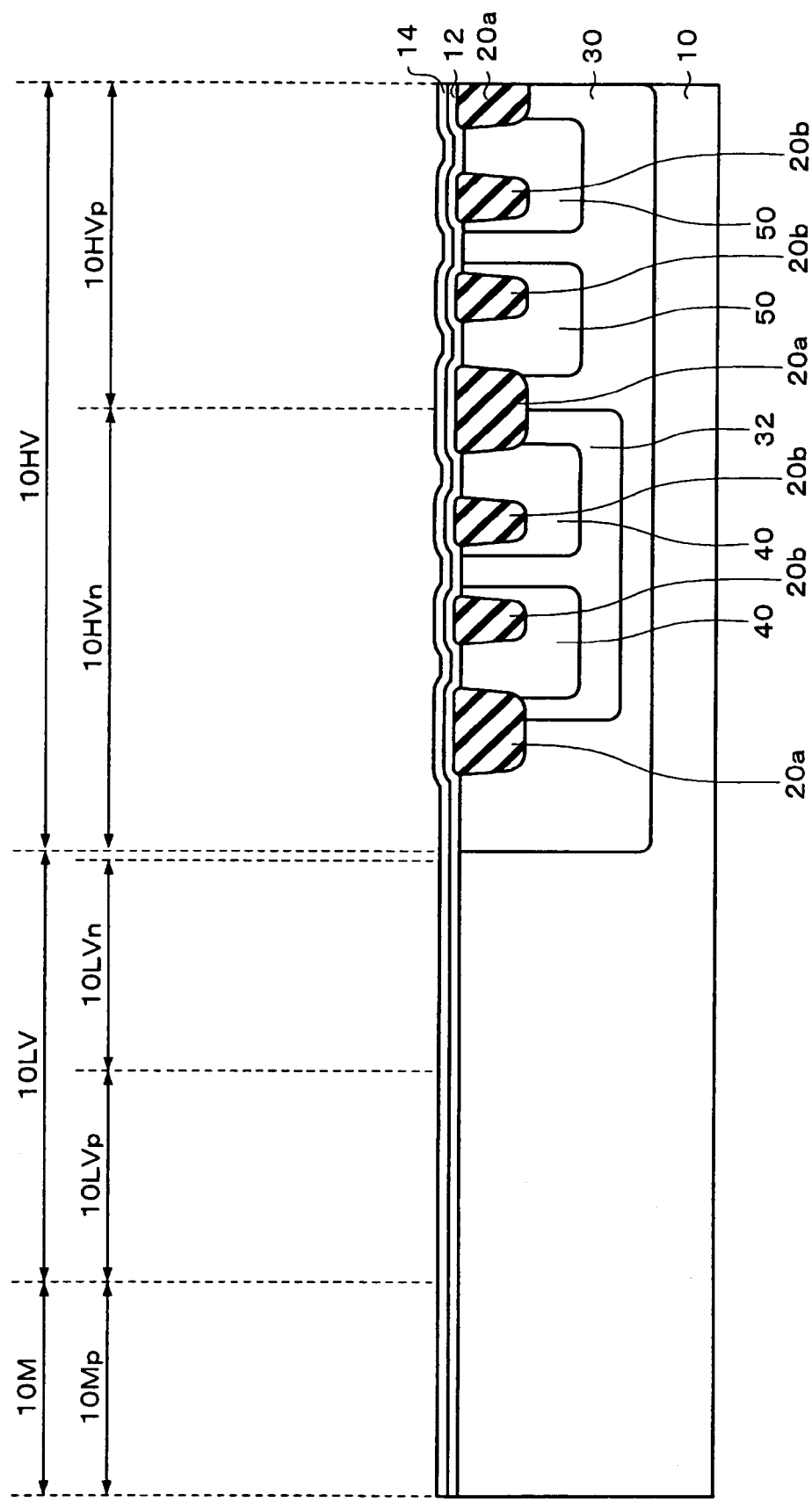
FIG. 7 is a sectional view illustrating the method for manufacturing a semiconductor device of the embodiment.

(6) As shown in FIG. 7, the impurity layer 40a and 50a are diffused by performing a heat treatment with a known technique so as to form the offset region 40 and 50 of the high-breakdown-voltage transistor 100P and 100N respectively.

(7) Next, a trench insulation layer 22 is formed so as to form a second element isolation region 210 in the low-voltage-drive transistor forming region 10LV and the MONOS forming region 10M as follows. (Refer to FIG. 10).

Figure 8:
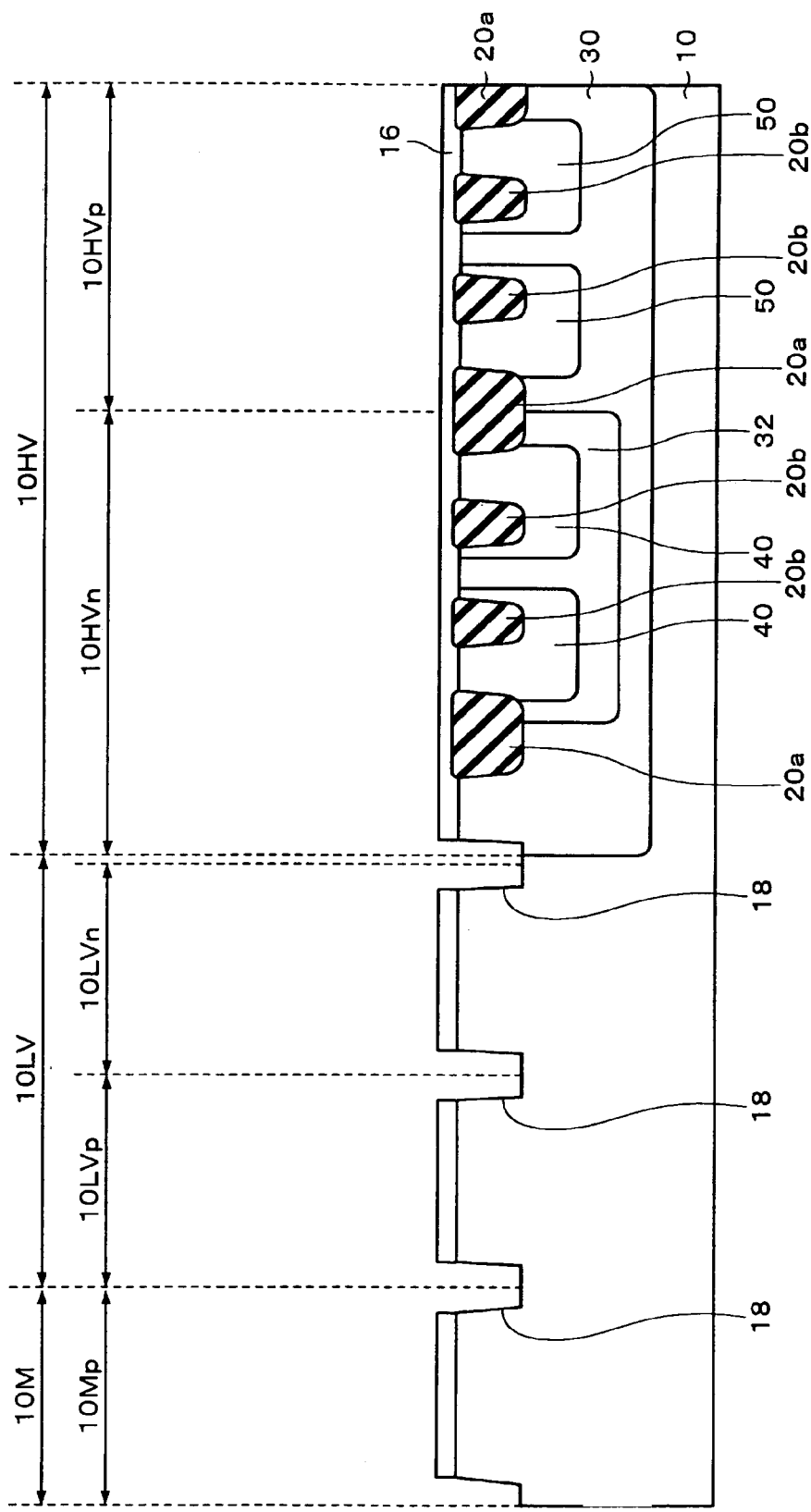
FIG. 8 is a sectional view illustrating the method for manufacturing a semiconductor device of the embodiment.
Figure 9:
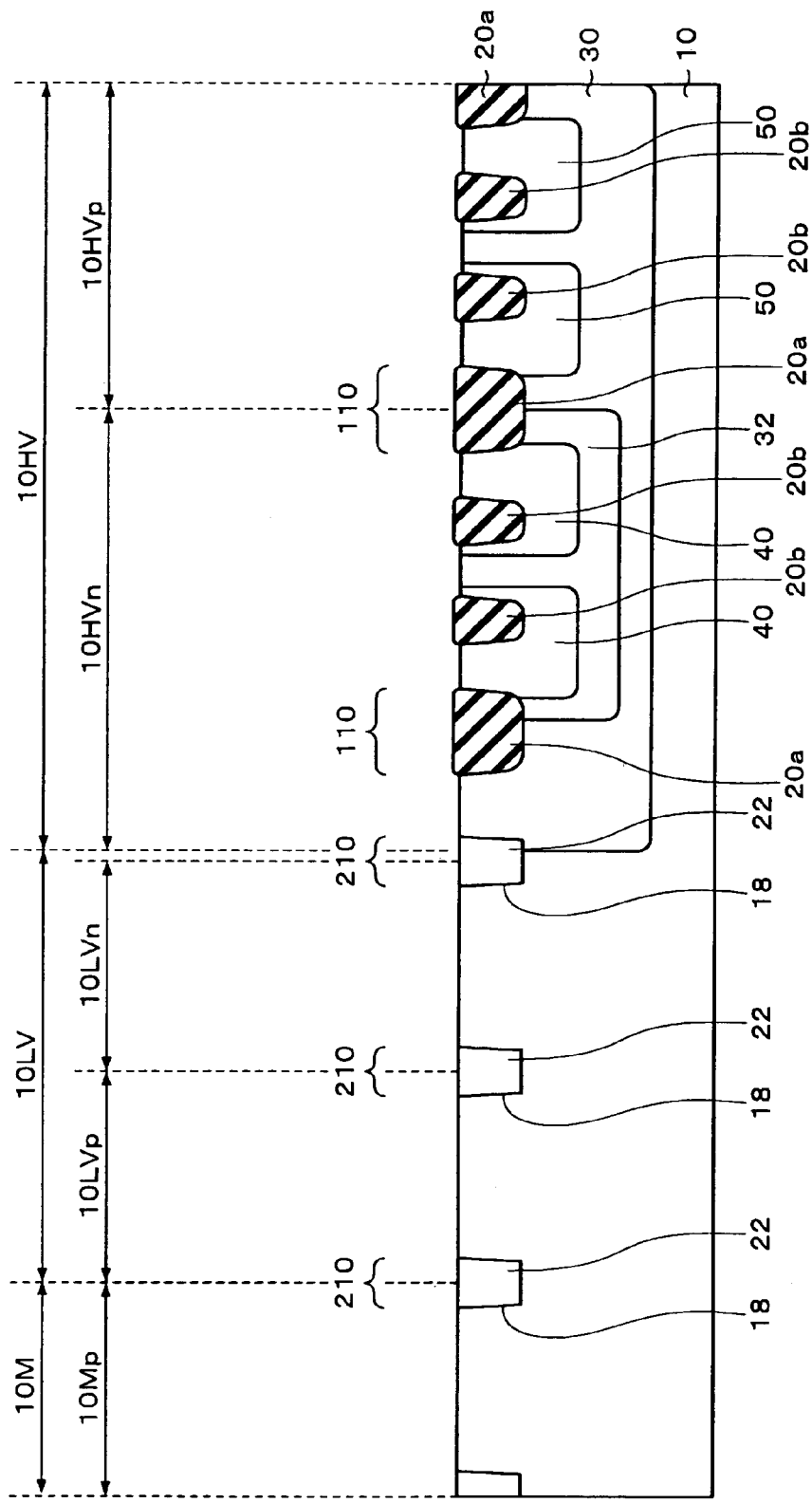
FIG. 9 is a sectional view illustrating the method for manufacturing a semiconductor device of the embodiment.

As shown in FIG. 8, a stopper layer 16 is formed over the whole surface of the semiconductor layer 10. For the stopper layer 16, for example, a multilayer film formed by a silicon oxide nitride layer on which a silicon nitride layer is deposited can be used. The stopper layer 16 can be formed, for example, by the CVD method or the like. A mask layer (not shown) that has an opening corresponding to the region for forming the second element isolation region 210 is formed on the stopper layer 16. As shown in FIG. 8, using the mask layer as a mask, the stopper layer 16 and the semiconductor layer 10 are etched by a known etching technique. As a result, a trench 18 is formed.

(8) A trench oxidation film (not shown in FIG. 9) is formed on a surface of the trench 18. The trench oxidation film is formed, for example, by a thermal oxidation method. The film thickness of the trench oxidation film is, for example, from 50 to 500 nm.

An insulation layer (not shown) is deposited over the whole surface of the semiconductor 10 so as to fill in the trench 18. The trench insulation layer 22 can be formed by the following processes. The deposited insulation layer is polished, for example, by a CMP method to expose the stopper layer 16. Then, the stopper layer 16 is removed by etching to expose the surface of the semiconductor layer 10.

Figure 10:
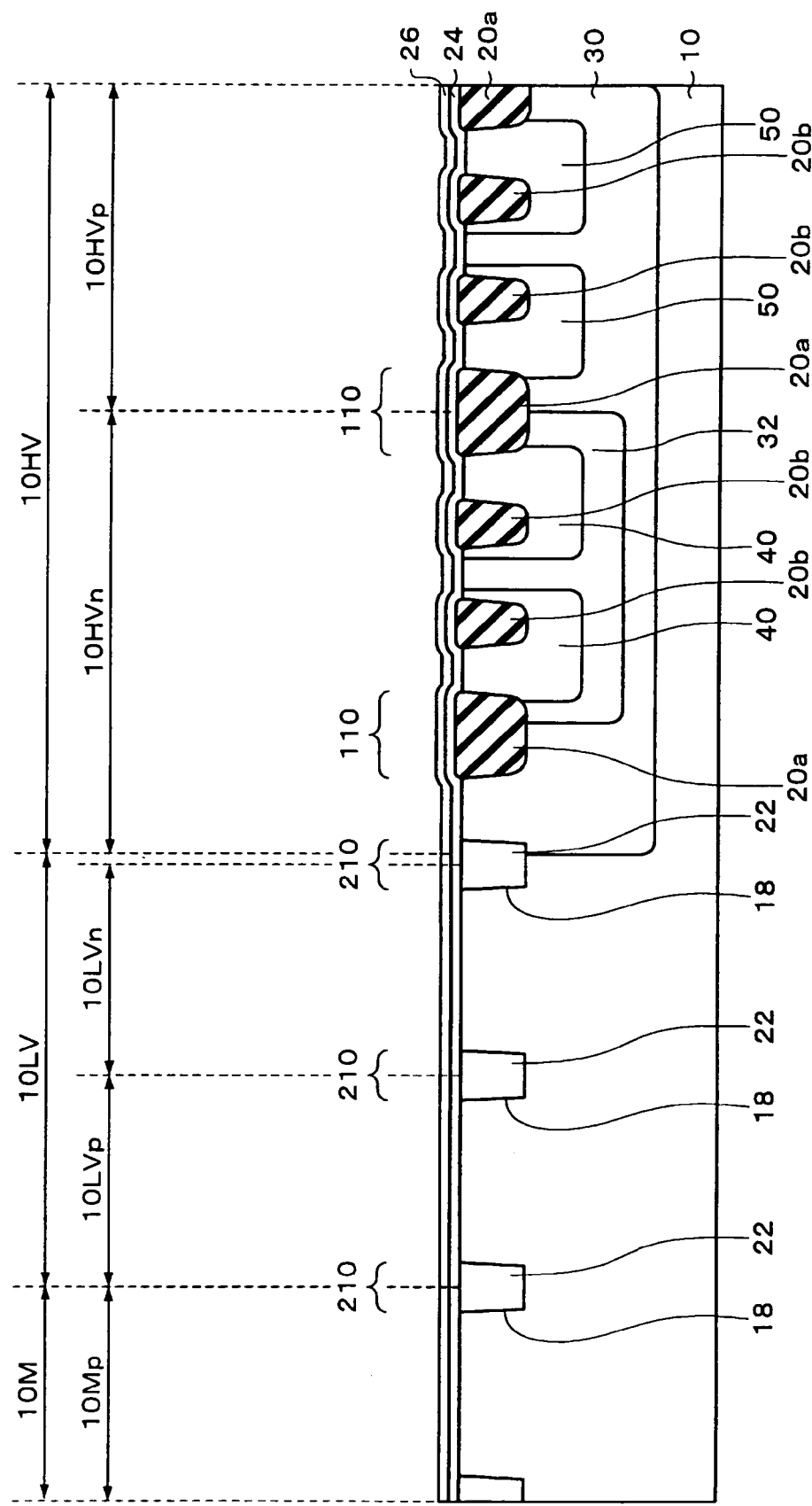
FIG. 10 is a sectional view illustrating the method for manufacturing a semiconductor device of the embodiment.

(9) As shown in FIG. 10, a first mask layer 24 and a second mask layer 26 are formed over the whole surface of the semiconductor layer 10. For the first mask layer 24, for example, the silicon oxide can be used. For the second mask layer 26, for example, the silicon nitride can be used. The first mask layer 24 can be formed, for example, by the thermal oxidation method. The second mask layer 26 can be formed, for example, by the CVD method.

Figure 11:
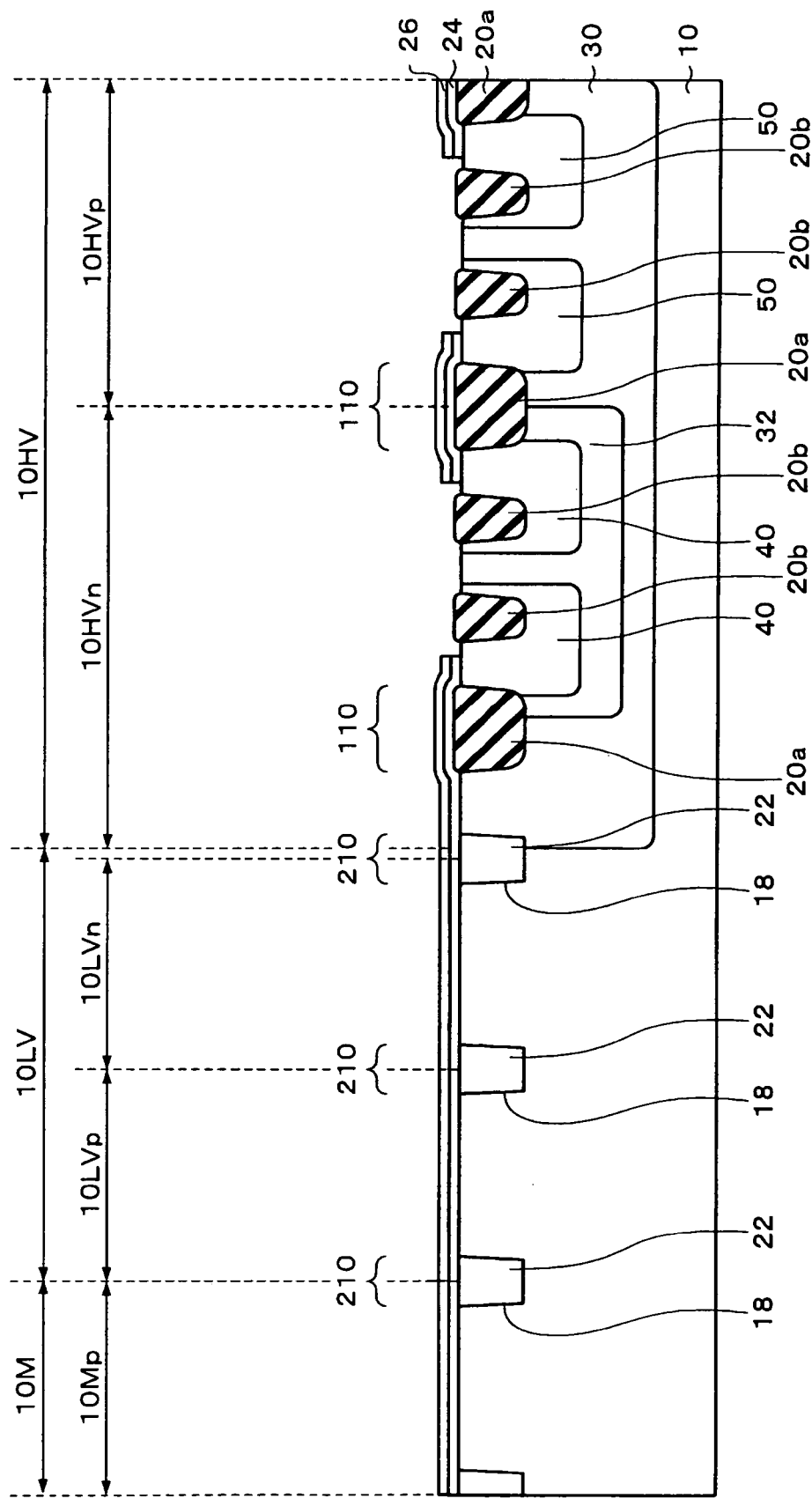
FIG. 11 is a sectional view illustrating the method for manufacturing a semiconductor device of the embodiment.

(10) In the high-breakdown-voltage transistor forming region 10HV, a resist layer (not shown) is formed so as to cover excluding the region (refer to FIG. 1) for forming the first gate insulation layer 60 of the n-type high-breakdown-voltage transistor 100N and the first gate insulation layer 60 of the p-type high-breakdown-voltage transistor 100P. As shown in FIG. 11, each region on which the resist layer is not formed by the second mask layer 26 and the first mask layer 24 are removed with the resist layer as a mask. The second mask layer 26 can be removed, for example, by a dry etching or a wet etching with phosphoric acid. In the high-breakdown-voltage transistor forming region 10HV, a channel doping can be carried out if required. The channel doping can be carried out prior to the formation of the mask layer 26 in the above-mentioned process (9). The first mask layer 24 can be removed, for example, by a wet etching with hydrofluoric acid.

Figure 12:
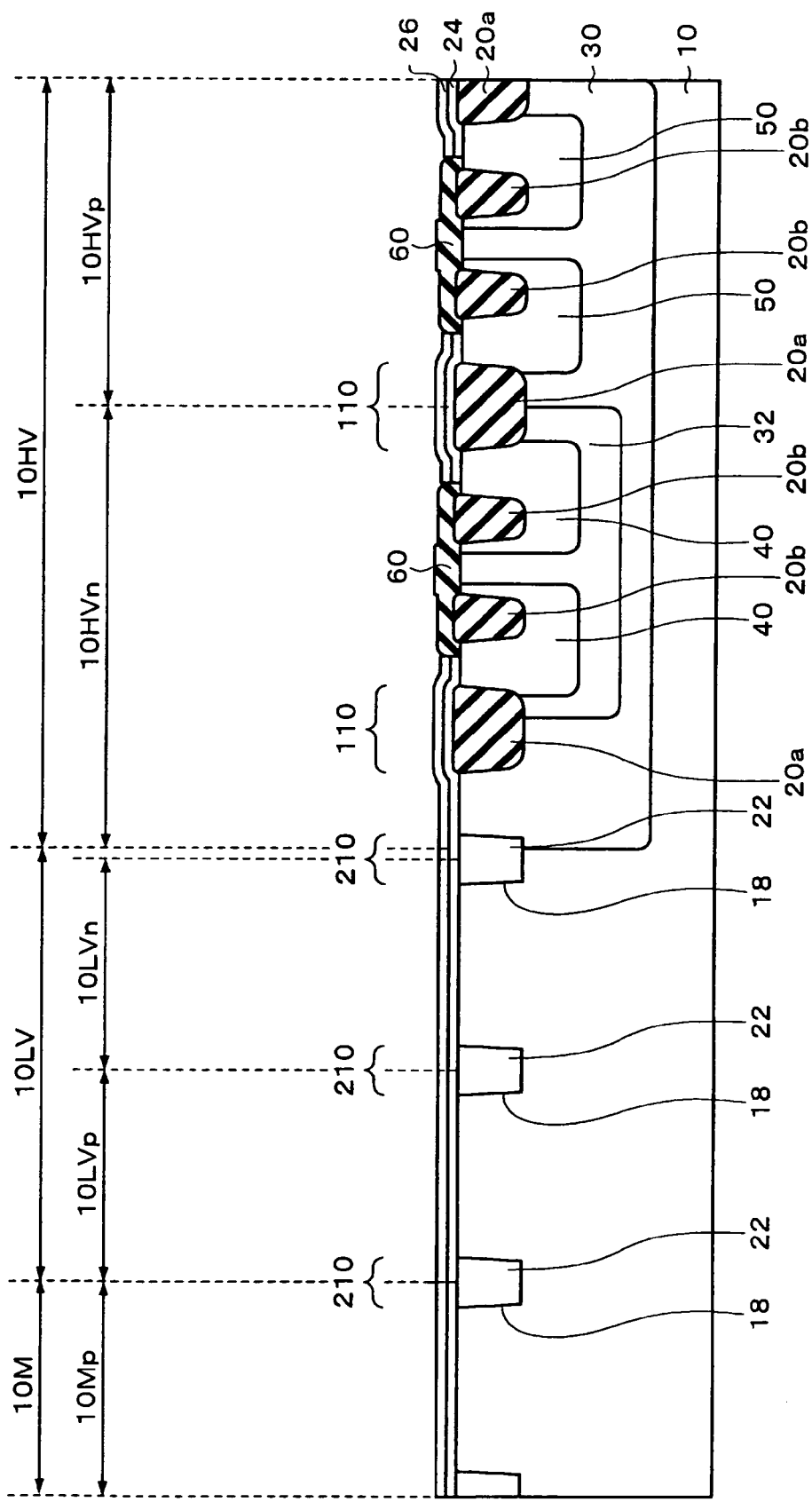
FIG. 12 is a sectional view illustrating the method for manufacturing a semiconductor device of the embodiment.

(11) As shown in FIG. 12, the first gate insulation layer 60 is formed in the high-breakdown-voltage transistor forming region 100. The first gate insulation layer 60 can be formed by a selective thermal oxidation method. The first mask layer 24 and the second mask layer 26 can be used as the mask for the selective thermal oxidation. The film thickness of the first gate insulation layer 60 is, for example, from 50 to 200 nm. Then, the second mask layer 26 is removed. If a silicon nitride is used for the second mask layer 26, the second mask layer 26 can be removed by the dry etching or the wet etching with phosphoric acid.

Figure 13:
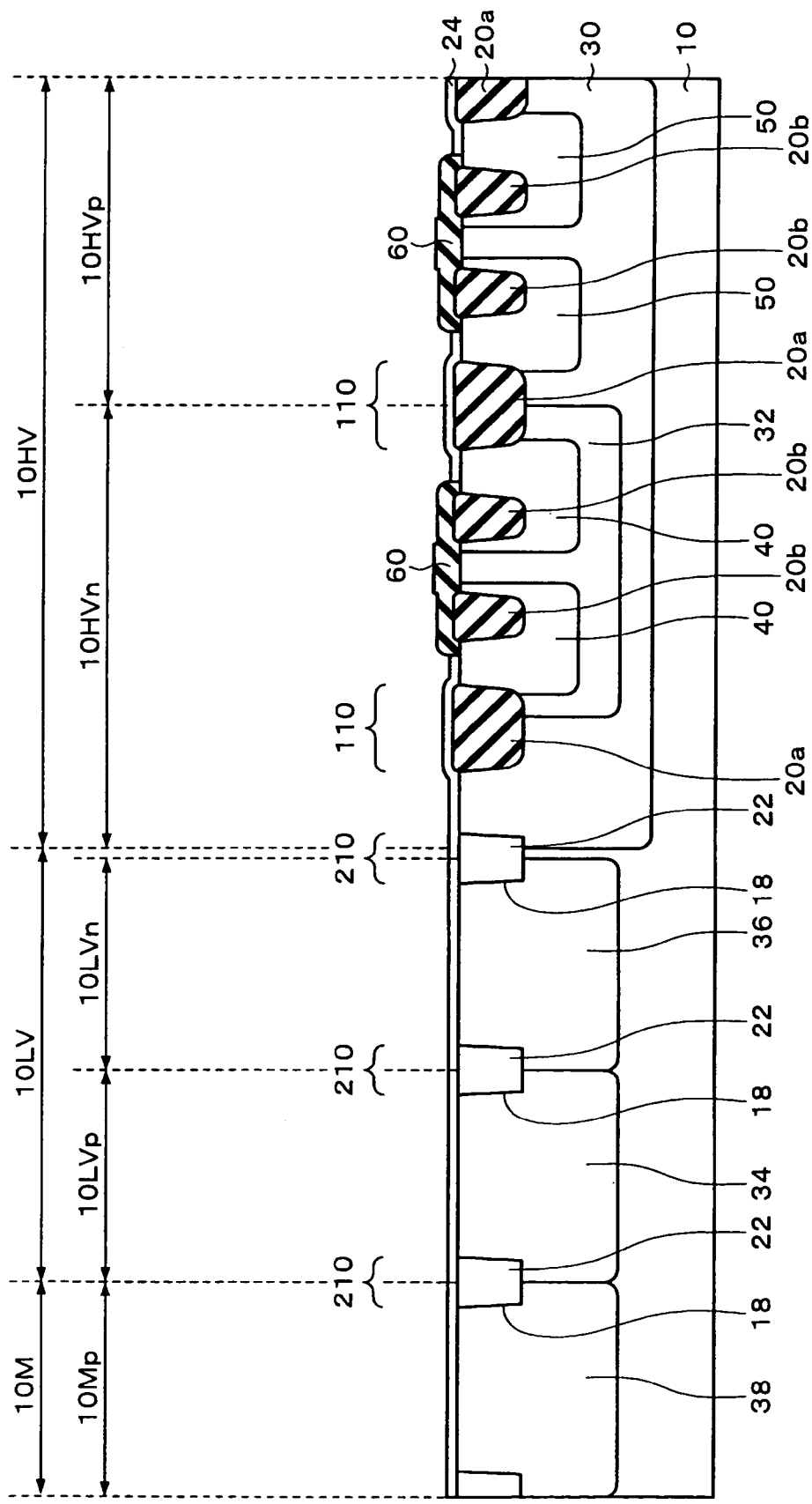
FIG. 13 is a sectional view illustrating the method for manufacturing a semiconductor device of the embodiment.

(12) Next, as shown in FIG. 13, a well is formed in the low-voltage-drive transistor forming region 10LV and the MONOS forming region 10M. The well can be formed, for example, by the following method.

A resist layer is formed so as to cover the low-voltage-drive transistor forming region 10LV except the p-type low-voltage-drive transistor forming region 10LVp and the p-type MONOS forming region 10Mp. Using the resist layer as a mask, the n-type impurity such like phosphorous, arsenic or the like is implanted into the p-type low-voltage-drive transistor forming region 10LVp at one time or several times with the first mask layer 24. As a result, the n-type second well 34 is formed in the p-type low-voltage-drive transistor forming region 10LVp. The n-type third well 38 is formed in the p-type MONOS forming region 10Mp. Then, the resist layer is removed.

Next, a resist layer is formed so as to cover the low-voltage-drive transistor forming region 10LV except the n-type low-voltage-drive transistor forming region 10LVn. Using the resist layer as a mask, the p-type impurity such like boron or the like is implanted into the n-type low-voltage-drive transistor forming region 10LVn at one time or several times with the first mask layer 24 so as to form the p-type second well 36. Then, the resist layer is removed. Subsequently, a channel doping can be carried out in the low-voltage-drive transistor forming region 10LV and the MONOS forming region 10M if required.

Figure 14:
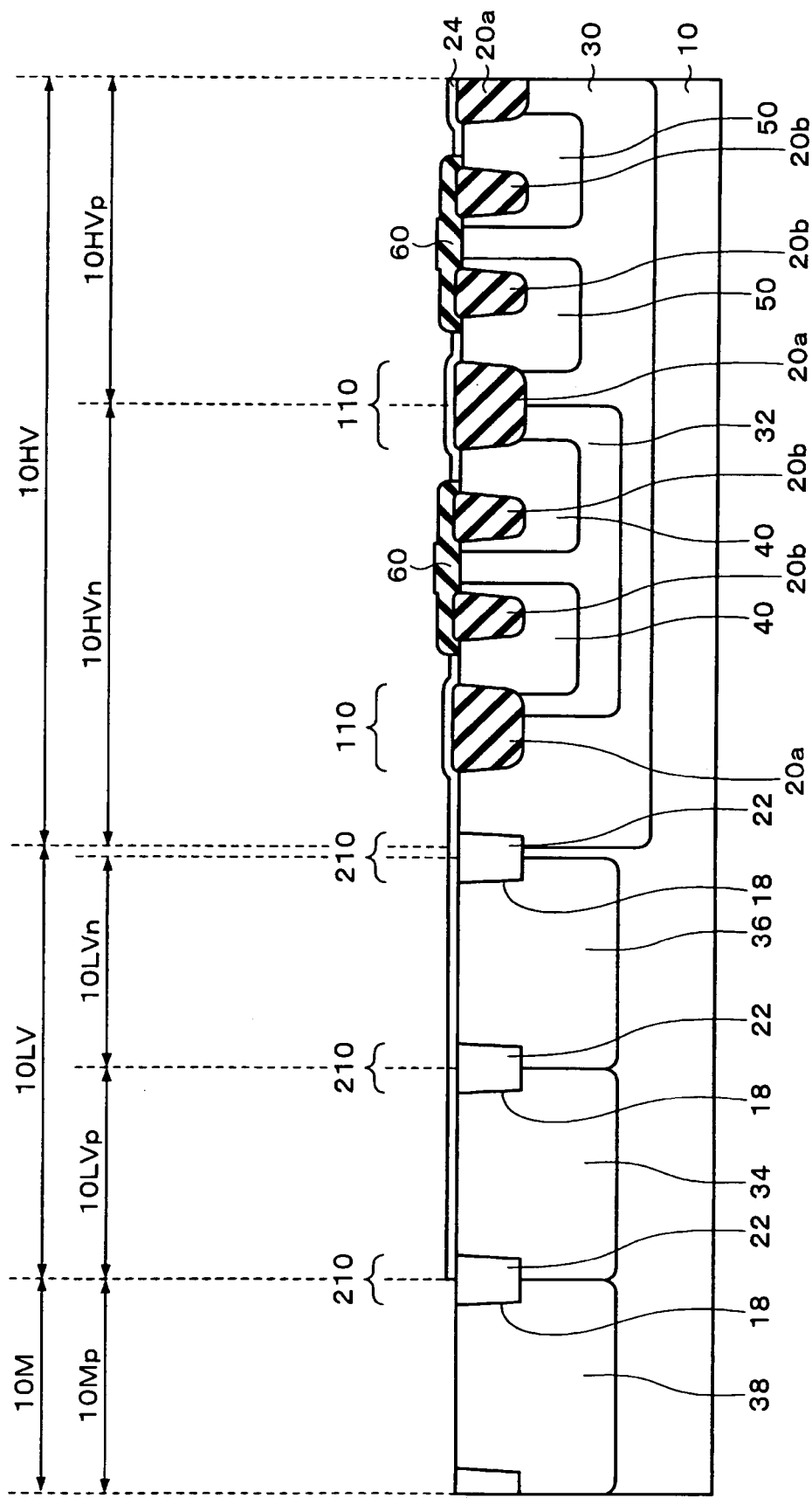
FIG. 14 is a sectional view illustrating the method for manufacturing a semiconductor device of the embodiment.

(13) As shown in FIG. 14, the first mask layer 24 in the MONOS forming region 10M is removed. The first mask layer 24 can be removed, for example, by the wet etching with hydrofluoric acid.

Figure 15:
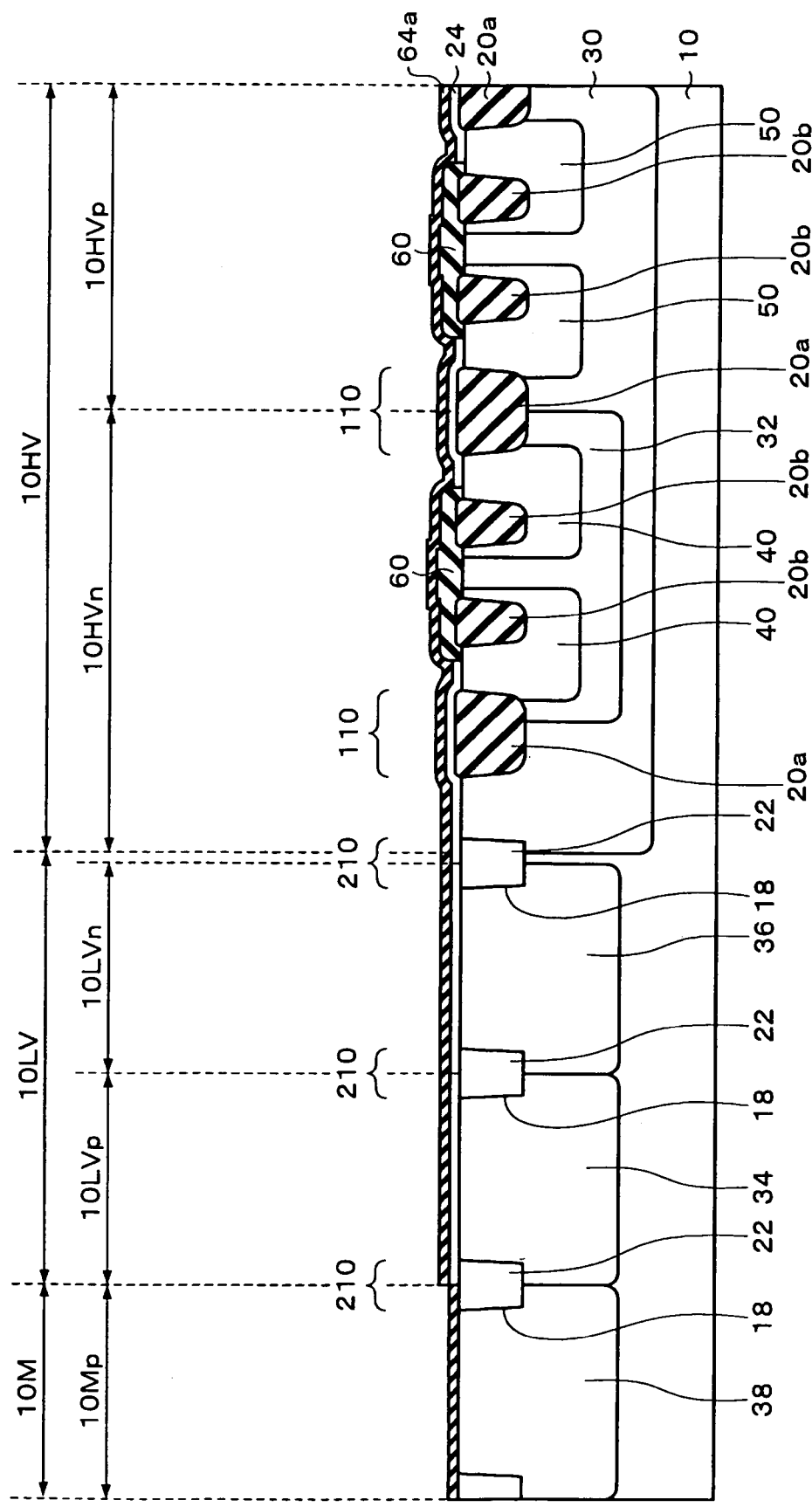
FIG. 15 is a sectional view illustrating the method for manufacturing a semiconductor device of the embodiment.
Figure 16:
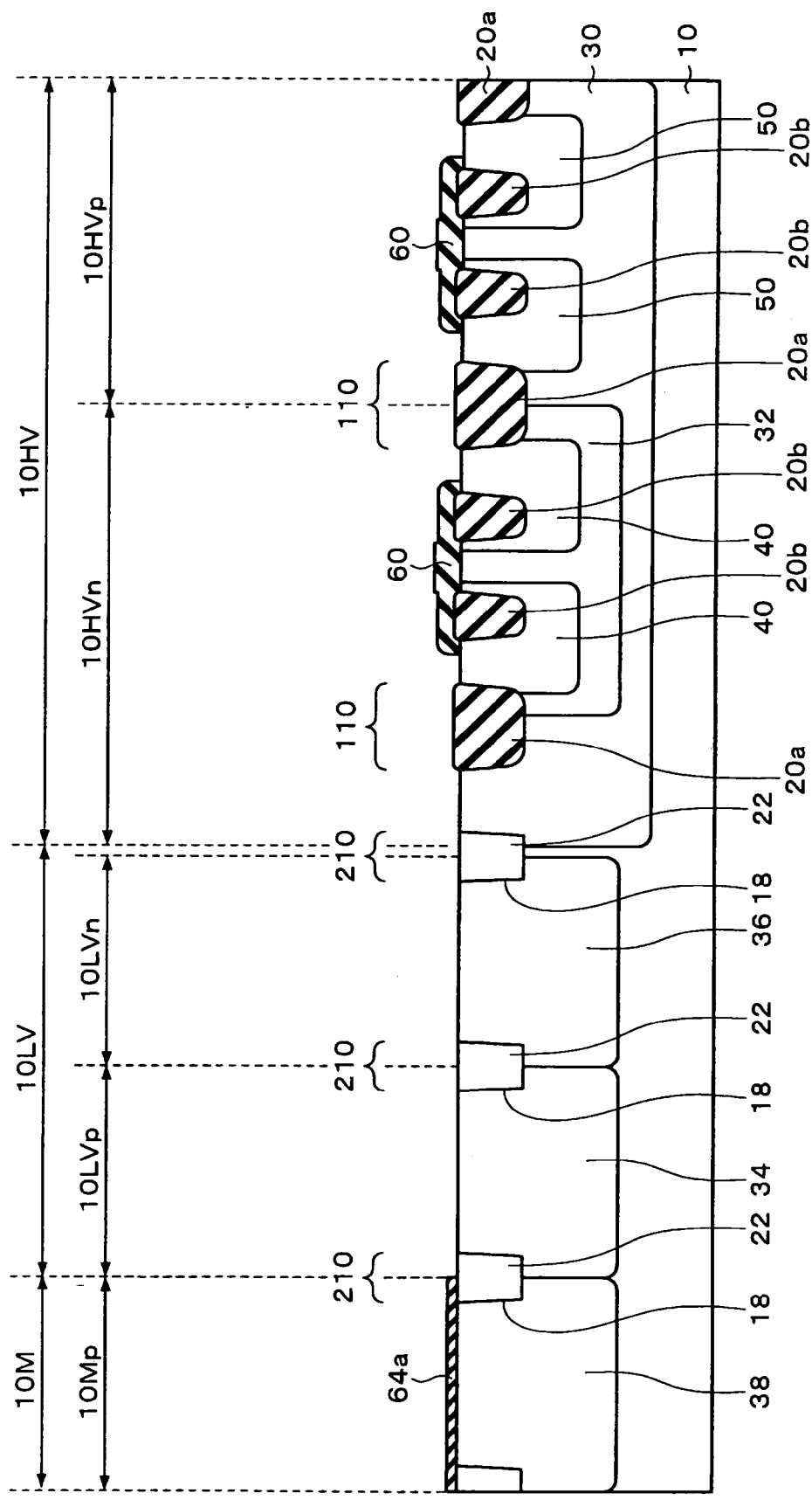
FIG. 16 is a sectional view illustrating the method for manufacturing a semiconductor device of the embodiment.

(14) As shown in FIG. 15, a multilayer film 64a in which the first silicon oxide layer, the silicon nitride layer, and the second silicon oxide layer are deposited is formed over the whole surface of the high-breakdown-voltage transistor forming region 10HV, the low-voltage-drive transistor forming region 10LV, and the MONOS forming region 10M. The first silicon oxide layer can be formed, for example, by the thermal oxidation method. The silicon nitride layer and the second silicon oxide layer can be formed, for example, by the CVD method.

(15) A resist layer (not shown in FIG. 16) is formed so as to cover the MONOS forming region. Then, the region on which the resist layer is not formed of the multilayer film 64a and the first mask layer 24 are removed. The multilayer film 64a can be removed, for example, by the wet etching, the dry etching, or a combination of wet etching and dry etching. Then, the resist layer is removed by the ashing.

Figure 17:
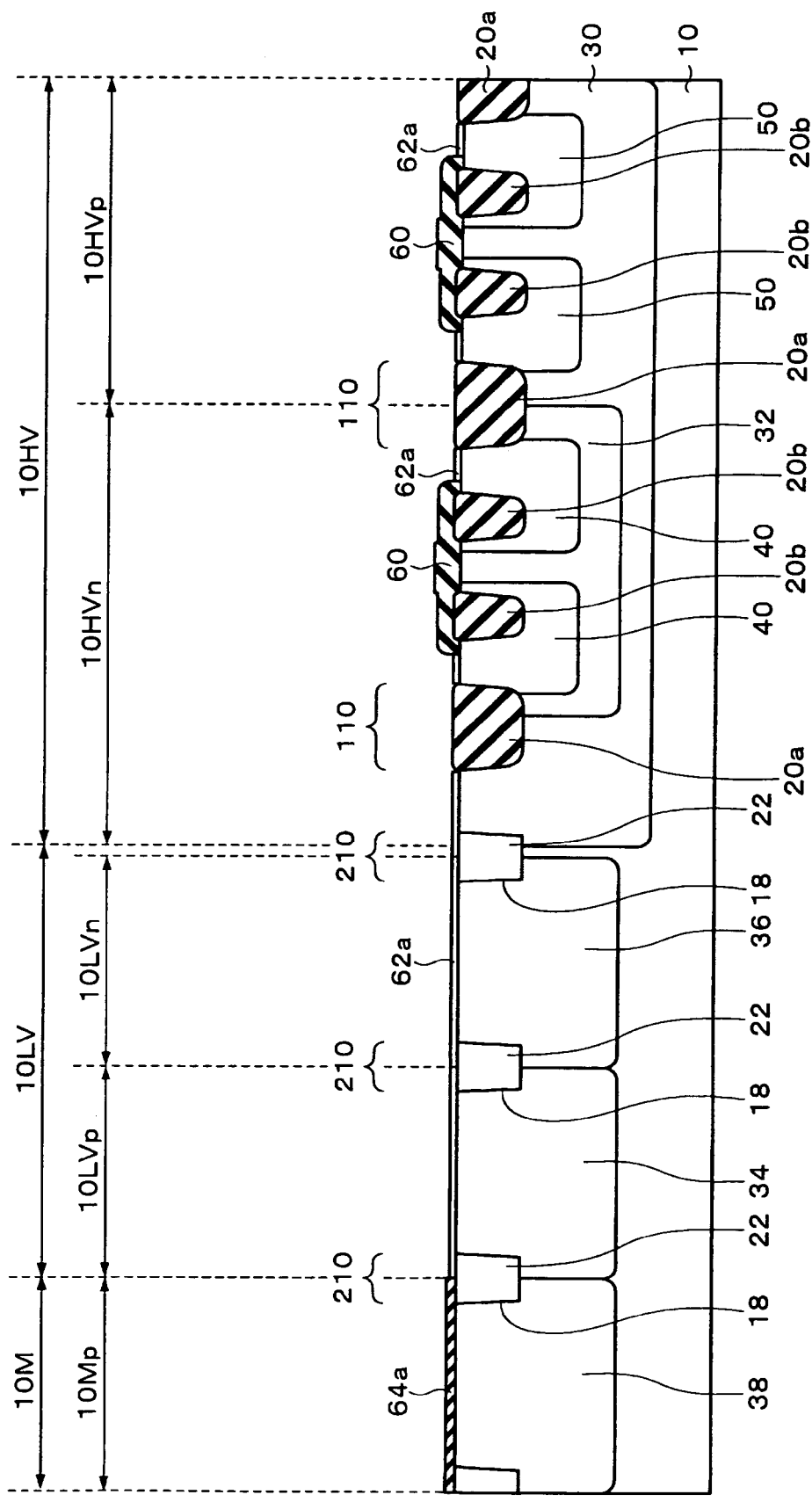
FIG. 17 is a sectional view illustrating the method for manufacturing a semiconductor device of the embodiment.

(16) As shown in FIG. 17, an insulation layer 62a is formed. The insulation layer 62a becomes the gate insulation layer 62 of the n-type low-voltage-drive transistor 200N and the gate insulation layer 62 of the p-type low-voltage-drive transistor 200P. (Refer to FIG. 1) The insulation layer 62a is formed, for example, by the thermal oxidation method. The film thickness of the insulation layer 62a is, for example, from 1.6 to 15 nm.

Figure 18:
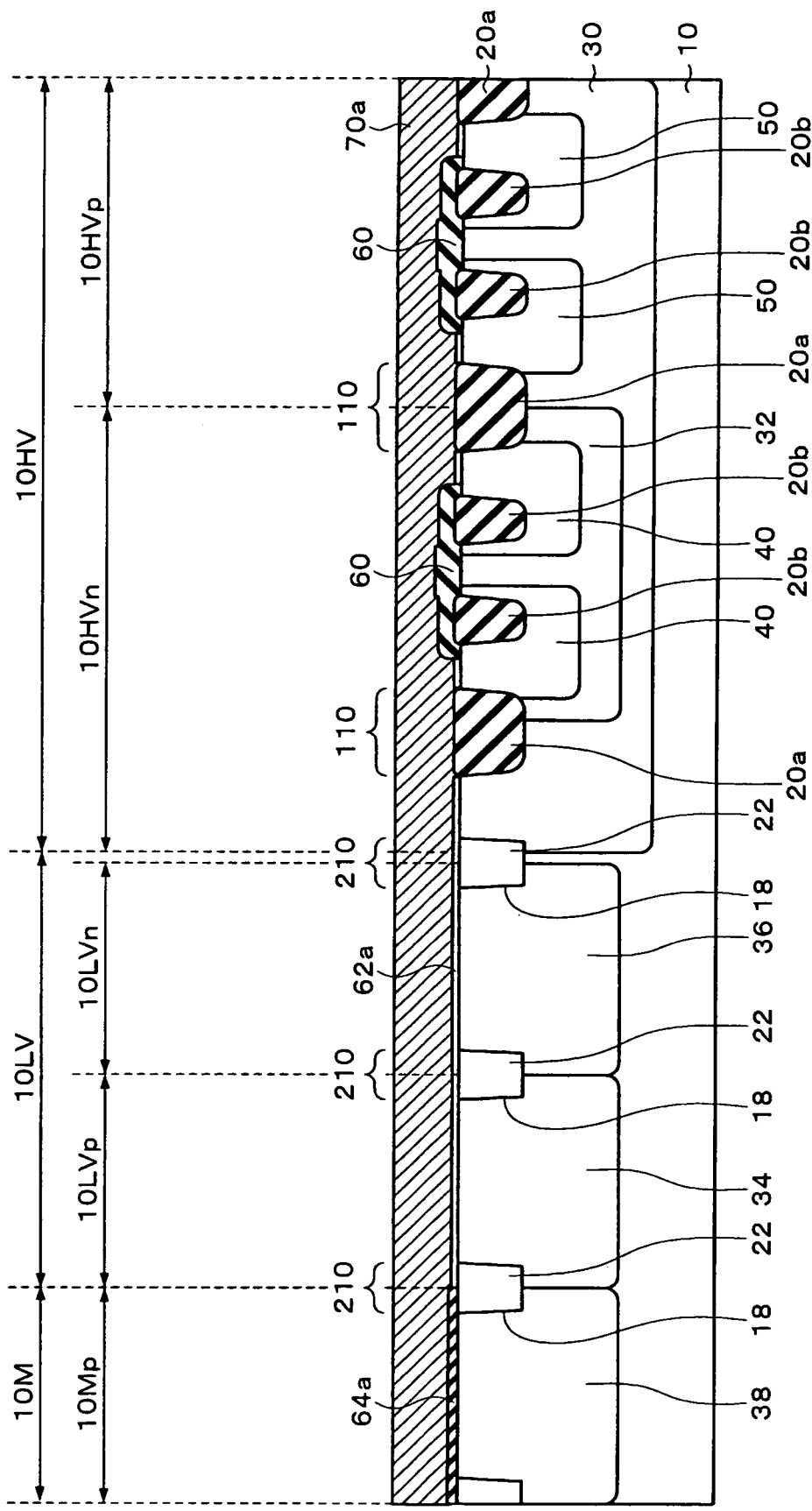
FIG. 18 is a sectional view illustrating the method for manufacturing a semiconductor device of the embodiment.

(17) As shown in FIG. 18, a conductive layer 70a is formed over the whole surface of the high-breakdown-voltage transistor forming region 10HV, the low-voltage-drive transistor forming region 10LV, and the MONOS forming region 10M. For the conductive layer 70a, for example, a polysilicon layer can be used. If a polysilicon is used as a material for the conductive layer 70a, a resistance value of the conductive layer 70a can be reduced by an ion implantation of an impurity into the conductive layer 70a.

Figure 19:
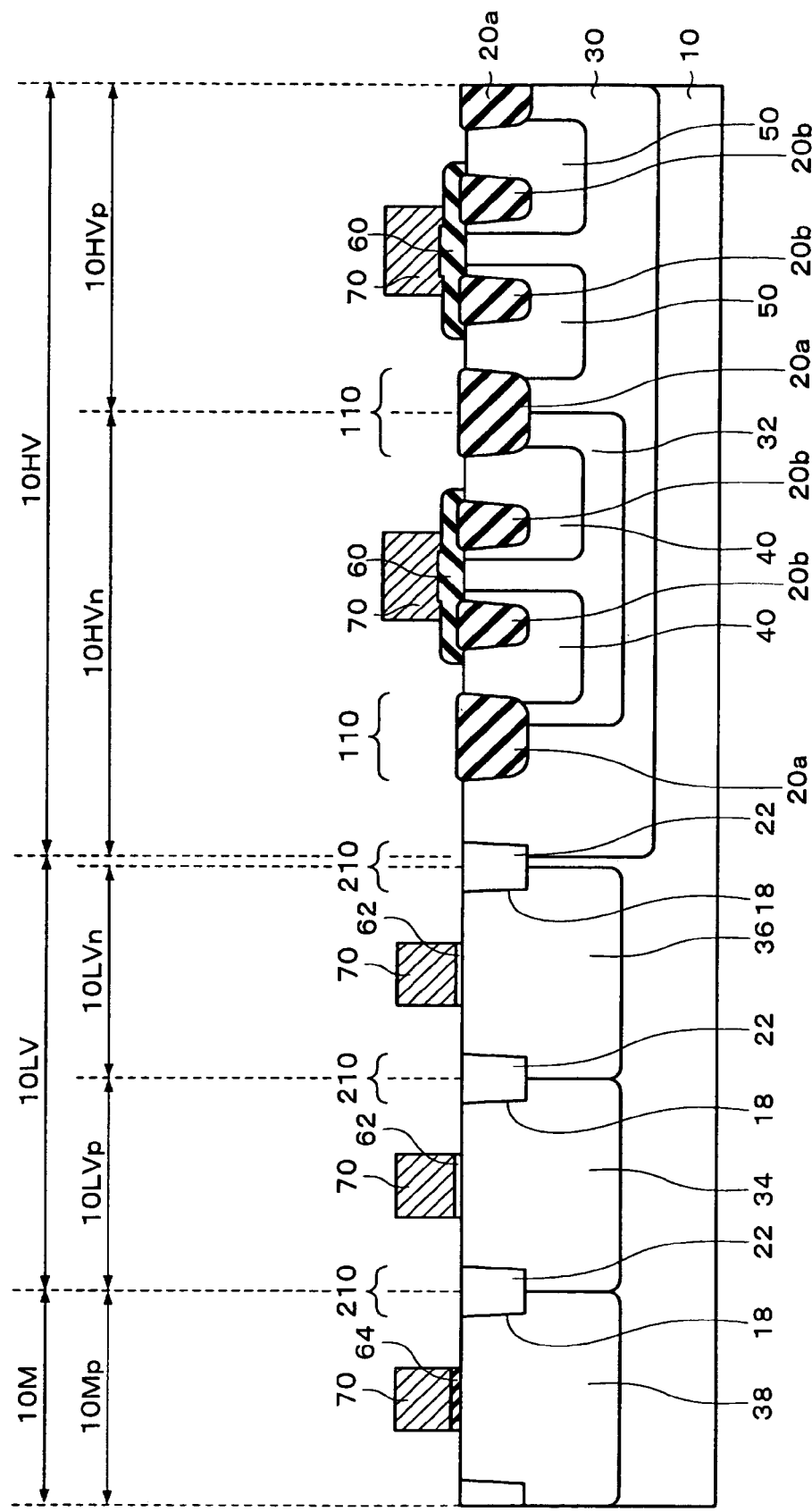
FIG. 19 is a sectional view illustrating the method for manufacturing a semiconductor device of the embodiment.

(18) As shown in FIG. 19, the gate electrode 70 of each transistor is formed. In addition, the gate insulation layer 62 of the n-type low-voltage-drive transistor 200N, the gate insulation layer 62 of the p-type low-voltage-drive transistor 200P, and the gate insulation layer 64 of the p-type MONOS type memory transistor 300P are formed. Specifically, a resist layer (not shown) having a fixed pattern is formed. By patterning the conductive layer 70a, the insulation layer 62a, and the multilayer film 64a (refer to FIG. 17) with the resist layer as a mask, the gate electrode 70 of each transistor, the gate insulation layer 62 of the n-type low-voltage-drive transistor 200N, the gate insulation layer 62 of the p-type low-voltage-drive transistor 200P, and the gate insulation layer 64 of the p-type MONOS type memory transistor 300P are formed.

Figure 20:
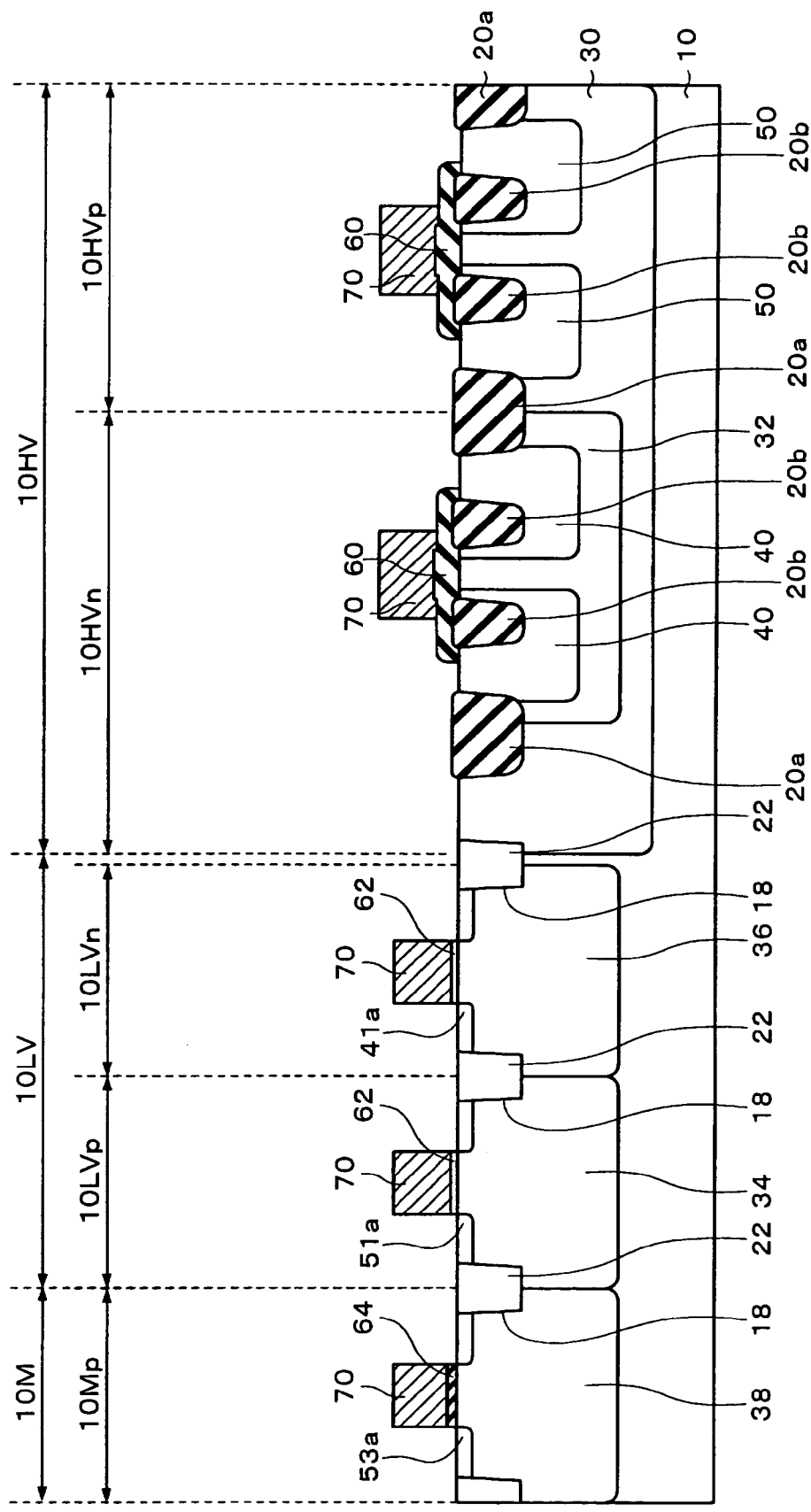
FIG. 20 is a sectional view illustrating the method for manufacturing a semiconductor device of the embodiment.

(19) As shown in FIG. 20, an impurity layer 41a to form an n-type extension region is formed in the n-type low-voltage-drive transistor forming region 10LVn. An impurity layer 51a to form a p-type extension region is formed in the p-type low-voltage-drive transistor forming region 10LVp. An impurity layer 53a to form a p-type extension region is formed in the p-type MONOS forming region 10Mp. The impurity layers 41a, 51a, and 53a can be formed by implanting a fixed impurity with a mask layer formed by common lithography technique.

Figure 21:
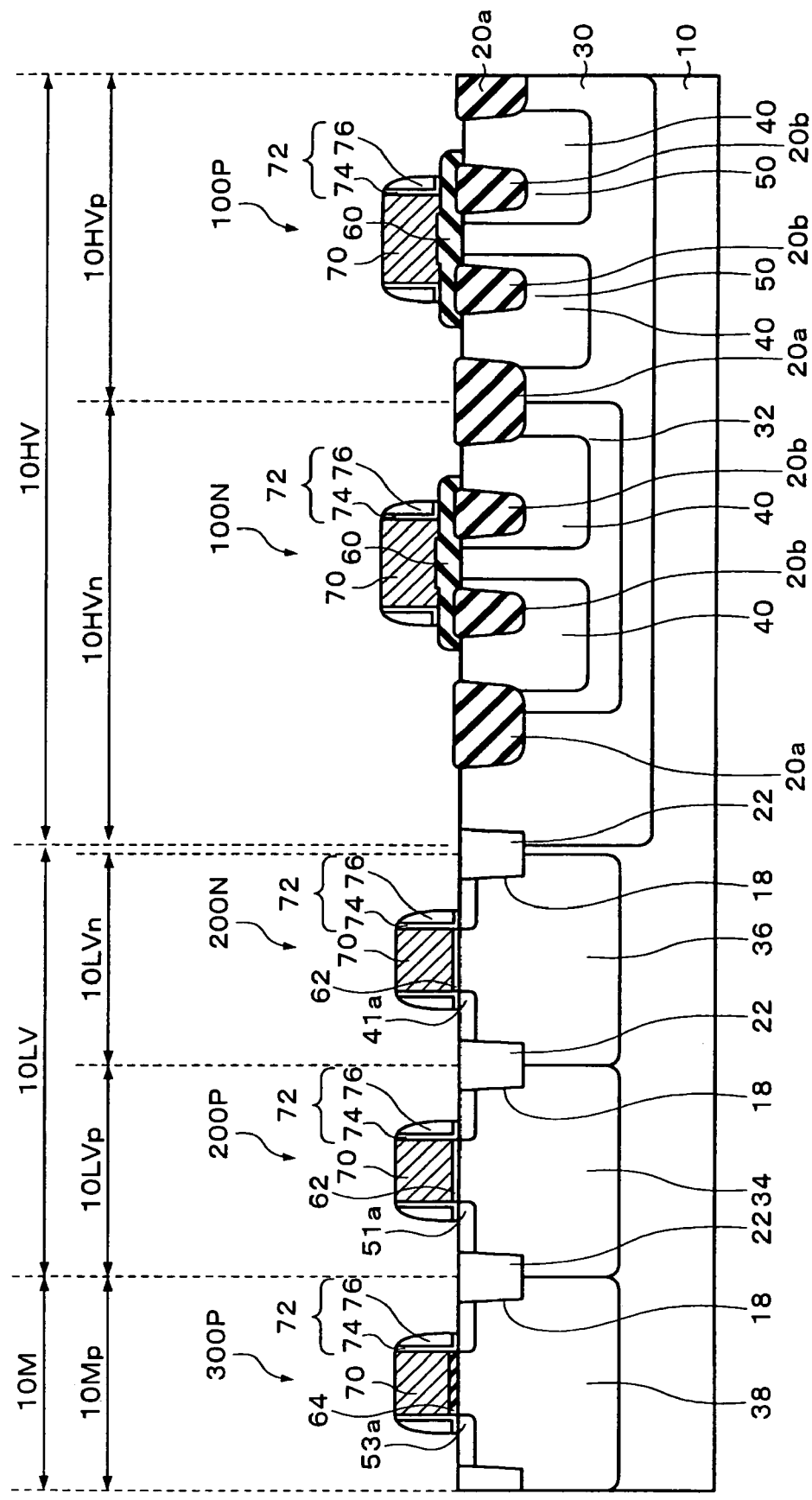
FIG. 21 is a sectional view illustrating the method for manufacturing a semiconductor device of the embodiment.

(20) An insulation layer (not shown in FIG. 21) is formed over the whole surface of the semiconductor layer 10. The insulation layer is subjected to an anisotropic etching so as to form the sidewall insulation layers 72 at the side of the gate electrode 70. In the example shown in FIG. 21, the insulation layer is, for example, the multilayer film in which the silicon oxide layer 74 and the silicon nitride layer 76 are deposited in this order. As shown in FIG. 21, the silicon oxide layer 74 is formed on the upper surface of the semiconductor layer 10 and the side of the gate electrode 70 as an L-shaped section. The film thickness of the silicon oxide layer 74 is, for example, approximately 10 nm. The film thickness of the silicon nitride layer 76 is, for example, approximately 70 nm.

(21) As shown in FIG. 1, the n-type source-drain region 42 is formed outside the sidewall insulation layers 72 in the semiconductor layer 10 by implanting the n-type impurity into a fixed region of the semiconductor layer 10 in the n-type high-breakdown-voltage transistor forming region 10HVn and the n-type low-voltage-drive transistor forming region 10LVn. The n-type source-drain region 42 can be formed by a known method.

Next, the p-type source-drain region 52 is formed outside the sidewall insulation layers 72 in the semiconductor layer 10 by implanting the p-type impurity into a fixed region of the semiconductor layer 10 in the p-type high-breakdown-voltage transistor forming region 10HVp, the p-type low-voltage-drive transistor forming region 10LVp, and the p-type MONOS forming region 10Mp. The p-type source-drain region 52 can be formed by a known method.

The semiconductor device of the embodiment can be manufactured by the above-mentioned processes. The method for manufacturing a semiconductor device is characterized as follows.

The method for manufacturing a semiconductor device of the embodiment enables the high-breakdown-voltage transistor, which needs high temperature process to form a deep well and thick gate insulation layer as compared with the low-voltage-drive transistor, and the MONOS type memory transistor, which needs the specific process for forming the multilayer film, to be provided together.

In addition, in the method for manufacturing a semiconductor device of the embodiment, the first mask layer 24 can be used as the mask for selective thermal oxidation in the process (11), in which the first gate insulation layer 60 of the n-type high-breakdown-voltage transistor 100N, and p-type high-breakdown-voltage transistor 100P are formed by the selective thermal oxidation method. Also, the first mask layer 24 functions as a protection layer for an ion implantation, if a well is formed by the ion implantation in the process (12), in which the well is formed in the low-voltage-drive transistor forming region 10LV, and the MONOS forming region 10M. Thus, the first mask layer 24 can be used in the above-mentioned two processes. As a result, manufacturing processes can be simplified.

The present invention is not limited to the above-mentioned embodiments. There may be many modifications, changes, and alterations without departing from the scope or spirit of the present invention. For example, while the MONOS type memory transistor is explained in the embodiment, the MNOS type memory transistor also can be manufactured in the same manner. Thus, the multiplayer film 64a can be the multilayer film deposited by at least two layers of the silicon oxide layer and the silicon nitride layer.

Also, while the semi-recessed LOCOS method is explained as the method for forming the offset insulation layer 20b in the embodiment, the LOCOS method or the recessed LOCOS method can be used.

Also, while a well in the low-voltage-drive transistor forming region 10LV, and the MONOS forming region 10M is formed after forming the trench insulation layer 22 in the embodiment, the well in the low-voltage-drive transistor forming region 10LV, and the MONOS forming region 10M can be formed prior to forming the trench insulation layer 22, namely prior to the above-mentioned process (7).

What is claimed is:

1. A method for manufacturing a semiconductor device that includes a high-breakdown-voltage transistor, a low-voltage-drive transistor, and a MNOS type memory transistor, the method comprising:
    (a) forming a first mask layer above a high-breakdown-voltage transistor forming region in which the high-breakdown-voltage transistor is formed, a low-voltage-drive transistor forming region in which the low-voltage-drive transistor is formed, and a MNOS type memory transistor forming region in which the MNOS type memory transistor is formed of a semiconductor layer;
    (b) forming a second mask layer above the first mask layer;
    (c) selectively removing portions of the first mask layer and the second mask layer above a first gate insulation layer forming region of the high-breakdown-voltage transistor;
    (d) after step c), forming a first insulation layer on the high-breakdown-voltage transistor forming region by a thermal oxidation method with the first mask layer and the second mask layer as a mask;
    (e) removing portions of the second mask layer remaining above the high-breakdown-voltage transistor forming region, the low-voltage-drive transistor forming region, and the MNOS type memory transistor forming region;
    (f) removing only the portion of the first mask layer formed above the MNOS type memory transistor forming region;
    (g) after steps (a)–(f), forming a multilayer film above the high-breakdown-voltage transistor forming region, the low-voltage-drive transistor forming region, and the MNOS type memory transistor forming region, the multilayer film being formed with at least a silicon oxide layer and a silicon nitride layer;
    (h) after step (g), simultaneously removing portions of the multilayer film formed above the high-breakdown-voltage transistor forming region and the low-voltage-drive transistor forming region;
    (i) after step (h), removing only the portion of the first mask layer remaining above the low-voltage-drive transistor forming region;
    (j) forming a second gate insulation layer on the low-voltage-drive transistor forming region;
    (k) simultaneously forming a gate electrode above each of the high-breakdown-voltage transistor forming region, the low-voltage-drive transistor forming region, and the MNOS type memory transistor forming region; and
    (l) forming a source-drain region in each of the high-breakdown-voltage transistor forming region, the low-voltage-drive transistor forming region, and the MNOS type memory transistor forming region.

2. The method for manufacturing a semiconductor device according to claim 1, wherein
    the multilayer film is formed such that a first silicon oxide layer, the silicon nitride layer, and a second silicon oxide layer are deposited.

3. The method for manufacturing a semiconductor device according to claim 1 or 2, further comprising:
    forming a well in each of the low-voltage-drive transistor forming region and the MNOS type memory transistor forming region by an ion implantation, wherein the ion implantation is performed with the first mask layer present.

4. The method for manufacturing a semiconductor device according to claims 1 or 2, further comprising:
    forming an element isolation region in the high-breakdown-voltage transistor forming region by a LOCOS method; and
    forming an element isolation region in the low-voltage-drive transistor forming region and the MNOS type memory transistor forming region by a trench element isolation method.

5. The method for manufacturing a semiconductor device according to claim 3, wherein
    the wells in the low-voltage-drive transistor forming region and the MNOS type memory transistor forming region are formed prior to forming the element isolation region in the low-voltage-drive transistor forming region and the MNOS type memory transistor forming region.

6. The method for manufacturing a semiconductor device according to claim 3, wherein
    the wells in the low-voltage-drive transistor forming region and the MNOS type memory transistor forming region are formed after forming the element isolation region in the low-voltage-drive transistor forming region and the MNOS type memory transistor forming region.

7. The method for manufacturing a semiconductor device according to any of claims 1 or 2, wherein
    the high-breakdown-voltage transistor is formed so as to include an offset insulation layer.

8. The method for manufacturing a semiconductor device according to claim 7, wherein
    the offset insulation layer is formed by a LOCOS method.

9. The method for manufacturing a semiconductor device according to claim 1, further comprising:
    forming an element isolation region in the high-breakdown-voltage transistor forming region by a LOCOS method; and
    forming an element isolation region in the low-voltage-drive transistor forming region and the MNOS type memory transistor forming region by a trench element isolation method.

10. A method for manufacturing a semiconductor device that includes a first-type transistor, a second-type transistor, and a third-type transistor, the method comprising:
    forming a first mask layer above a first transistor forming region in which the first-type transistor is formed, a second transistor forming region in which the second-type transistor is formed, and a third transistor forming region in which the third-type transistor is formed of a semiconductor layer;

subsequently forming a second mask layer above the first mask layer;

selectively removing portions of the first mask layer and the second mask layer above a first gate insulation layer forming region of the first-type transistor;

subsequently forming a first insulation layer on the first transistor forming region by a thermal oxidation method with the first mask layer and the second mask layer as a mask;

removing portions of the second mask layer remaining above the first transistor forming region, the second transistor forming region, and the third transistor forming region;

removing only the portion of the first mask layer formed above the third transistor forming region;

subsequently forming a multilayer film above the first transistor forming region, the second transistor forming region, and the third transistor forming region, the multilayer film being formed with at least a silicon oxide layer and a silicon nitride layer;

subsequently removing portions of the multilayer film formed above the first transistor forming region and the second transistor forming region concurrently;

subsequently removing only the portion of the first mask layer remaining above the second transistor forming region;

forming a second gate insulation layer on the second transistor forming region;

simultaneously forming a gate electrode above each of the first transistor forming region, the second transistor forming region, and the third transistor forming region; and forming a source-drain region in each of the first transistor forming region, the second transistor forming region, and the third transistor forming region.

11. A method for manufacturing a semiconductor device that includes a high-breakdown-voltage transistor, a low-voltage-drive transistor, and a MNOS type memory transistor, the method comprising the following steps in the order recited:

forming a first mask layer above a high-breakdown-voltage transistor forming region in which the high-breakdown-voltage transistor is formed, a low-voltage-drive transistor forming region in which the low-voltage-drive transistor is formed, and a MNOS type memory transistor forming region in which the MNOS type memory transistor is formed of a semiconductor layer;

forming a second mask layer above the first mask layer;

selectively removing portions of the first mask layer and the second mask layer above a first gate insulation layer forming region of the high-breakdown-voltage transistor;

forming a first insulation layer on the high-breakdown-voltage transistor forming region by a thermal oxidation method with the first mask layer and the second mask layer as a mask;

removing portions of the second mask layer remaining above the high-breakdown-voltage transistor forming region, the low-voltage-drive transistor forming region, and the MNOS type memory transistor forming region;

removing only the portion of the first mask layer formed above the MNOS type memory transistor forming region;

forming a multilayer film above the high-breakdown-voltage transistor forming region, the low-voltage-drive transistor forming region, and the MNOS type memory transistor forming region, the multilayer film being formed with at least a silicon oxide layer and a silicon nitride layer;

simultaneously removing portions of the multilayer film formed above the high-breakdown-voltage transistor forming region and the low-voltage-drive transistor forming region;

removing only the portion of the first mask layer remaining above the low-voltage-drive transistor forming region;

forming a second gate insulation layer on the low-voltage-drive transistor forming region;

simultaneously forming a gate electrode above each of the high-breakdown-voltage transistor forming region, the low-voltage-drive transistor forming region, and the MNOS type memory transistor forming region; and forming a source-drain region in each of the high-breakdown-voltage transistor forming region, the low-voltage-drive transistor forming region, and the MNOS type memory transistor forming region.

* * * * *